United States Patent [19]

Sangyoji et al.

[11] Patent Number: 4,965,592

[45] Date of Patent: Oct. 23, 1990

[54] IMAGE PROCESSING APPARATUS FOR REPRODUCING IMAGES ON PROJECTOR SCREEN AND PHOTOSENSITIVE MEDIUM

[75] Inventors: Kazuo Sangyoji; Takemi Yamamoto, both of Nagoya; Naoyuki Hatta, Gamagori; Kenji Sakakibara, Ichinomiya; Yuji Asano; Yoshimasa Hara, both of Nagoya; Yumio Matsumoto, Kasugai; Kiyoharu Hayakawa, Aichi, all of Japan

[73] Assignee: Brother Kogyo Kabushiki Kaisha, Aichi, Japan

[21] Appl. No.: 195,280

[22] Filed: May 18, 1988

[30] Foreign Application Priority Data

| May 21, 1987 | [JP] | Japan | 62-124154 |
| May 21, 1987 | [JP] | Japan | 62-124155 |
| May 29, 1987 | [JP] | Japan | 62-135376 |
| Jun. 9, 1987 | [JP] | Japan | 62-88967[U] |
| Sep. 4, 1987 | [JP] | Japan | 62-222792 |
| Sep. 17, 1987 | [JP] | Japan | 62-233236 |

[51] Int. Cl.$^5$ .................. G01D 15/16; H04N 1/46
[52] U.S. Cl. .................. 346/110 R; 358/75; 358/296
[58] Field of Search ............ 346/110 R, 17, 107 R, 346/108; 358/296, 302, 300, 75; 430/138

[56] References Cited

U.S. PATENT DOCUMENTS

| 3,619,049 | 11/1971 | Starkweather. | |
| 4,067,650 | 1/1978 | Spence-Bate | 346/110 R |
| 4,433,906 | 2/1984 | Nakatani et al. | |
| 4,701,397 | 10/1987 | Rourke et al. | 430/138 |
| 4,734,761 | 3/1988 | Kondoh | 346/110 R |
| 4,766,051 | 8/1988 | Breton et al. | 430/138 |

FOREIGN PATENT DOCUMENTS

| 1282433 | 7/1972 | United Kingdom. |
| 1286293 | 8/1972 | United Kingdom. |
| 1374826 | 11/1974 | United Kingdom. |
| 1512484 | 6/1978 | United Kingdom. |
| A2021793 | 3/1979 | United Kingdom. |
| A2071356 | 2/1981 | United Kingdom. |
| A2070790 | 9/1981 | United Kingdom. |
| A2117525 | 2/1983 | United Kingdom. |
| 2135468 | 8/1984 | United Kingdom. |
| 2159973 | 12/1985 | United Kingdom. |

Primary Examiner—Mark J. Reinhart
Attorney, Agent, or Firm—Oliff & Berridge

[57] ABSTRACT

An image processing apparatus, including an irradiating device for emitting an image radiation representative of an original image, a projecting device having a viewing screen which is irradiated by the image radiation from the irradiating device and which provides a view of a visible image represented by the image radiation, and an exposing device for exposing a photosensitive recording medium to the image radiation from the irradiating device to produce a visible image represented by said image radiation. The apparatus further includes an optical guide device for directing the image radiation from the irradiating device to the projecting device and the exposing device.

17 Claims, 19 Drawing Sheets

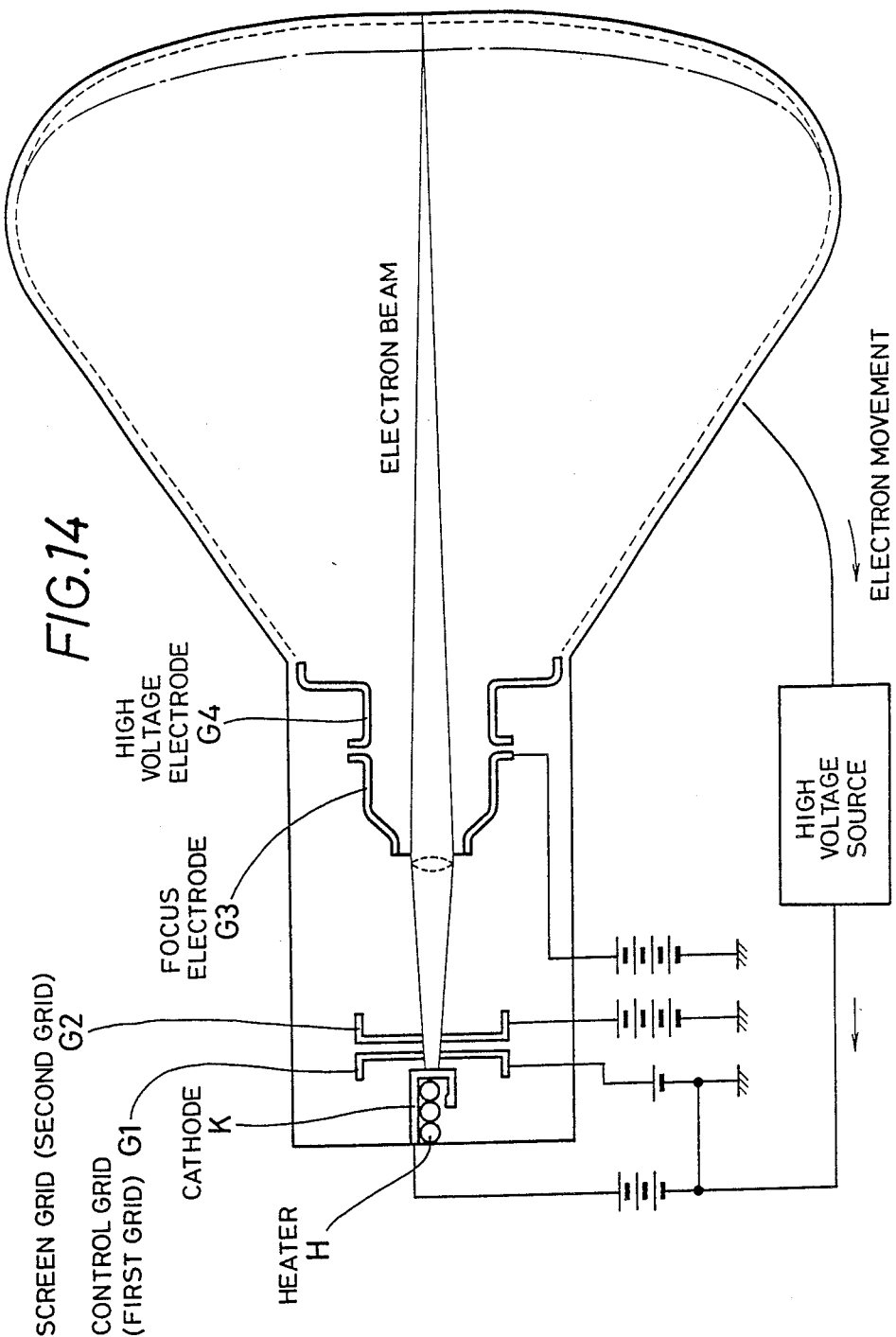

IMAGE PROCESSING APPARATUS FOR REPRODUCING IMAGES ON PROJECTOR SCREEN AND PHOTOSENSITIVE MEDIUM

BACKGROUND OF THE INVENTION

1. Field of the Invention

The present invention relates generally to an imaging or image processing apparatus, and more particularly to such an imaging apparatus capable of projecting images on a viewing screen and copying the images on a photosensitive recording medium, which apparatus uses irradiating means for emitting an image radiation representative of an original image to be reproduced.

2. Discussion of the Prior Art

Video printers recently available include an apparatus of the type which uses a built-in cathode ray tube or Braun tube and a lens system for exposing a photographic paper containing silver halide salts, and a color printer which operates according to digital video signals.

While these known video printers are capable of serving as a printing apparatus, but are incapable of producing an image on viewing screen. If the latter function is desired, the printers require an image display device such as a cathode ray tube (in addition to the cathode ray tube for exposing the photographic paper), which leads to a complicated construction of the printers and an increased cost of manufacture.

SUMMARY OF THE INVENTION

It is accordingly a first object of the present invention to provide an inexpensive simple image processing apparatus which is capable of both projecting images on a screen and reproducing the images on a photosensitive recording medium.

A second object of the invention is to provide such an image processing apparatus which permits an image to be projected on a viewing screen while the image is concurrently reproduced on a photosensitive recording medium.

It is a third object of the invention to provide such an image processing apparatus capable of projecting images on a screen and reproducing the images on a photosensitive recording medium, wherein image signals for projecting the images and reproducing the images on the recording medium are controlled so as to provide an optimum or nominal imaging on both the projecting screen and the recording medium, as viewed by human eyes.

It is a fourth object of the present invention to provide an irradiating device suitable for such an image processing apparatus as described above.

The above first object may be achieved according to the principle of the present invention, which provides an image processing apparatus, comprising irradiating means for emitting an image radiation representative of an original image, projecting means having a viewing screen which is irradiated by the image radiation from the irradiating means and which provides a view of a visible image represented by the image radiation, exposing means for exposing a photosensitive recording medium to the image radiation from the irradiating means, and optical guide means for directing the image radiation from the irradiating means to the projecting means and the exposing means.

The viewing screen may be incorporated within the apparatus, or alternatively provided at a suitable location.

In the image processing apparatus of the present invention constructed as described above, the image radiation emitted by the irradiating means is directed by the optical guide means to the projecting means, to provide a visible image on the viewing screen of the projecting means, so that the operator of the apparatus or audience may observe the image. Where it is desired to produce a hard copy of the same image, the optical guide means is operated to direct the image radiation to the exposing means, so that the photosensitive medium is imagewise exposed to the image radiation.

In one form of the instant apparatus of the invention, the optical guide means comprises optical path selecting means which is operable between a projecting position in which the image radiation is directed to the viewing screen of the projecting means, and an exposing position in which the image radiation is directed to the exposing means. The optical path selecting means may include a mirror which is movable between a first position in which the mirror reflects the image radiation toward one of the viewing screen of the projecting means and the exposing means, and a second position in which the mirror permits transmission of the image radiation toward the other of the viewing screen and the exposing means.

In the above form of the invention, the irradiating means may comprise a full-color imaging cathode ray tube, and luminance changing means for changing a luminance of the cathode ray tube for at least one of primary colors (blue, green and red) of light to an optimum value for exposure of the photosensitive recording medium by the exposing means, where the optical path selecting means is operated from the projecting position to the exposing position. In this case, the photosensitive recording medium is exposed to the suitably adjusted radiant energy or energies corresponding to the above-indicated at least one primary color of light of the image radiation, which energies differ from those for projecting the image on the viewing screen of the projecting means. Thus, the image reproduced on the photosensitive medium is given an excellent color balance.

The luminance changing means indicated above may include converting means for converting an original intensity signal applied to the cathode ray tube for the above-indicated at least one primary color of light so as to produce a nominal color imaging on the viewing screen, to a modified intensity signal applied to the cathode ray tube so as to produce a nominal color imaging on the photosensitive recording medium, according to a relationship between an intensity of the image radiation for the primary color or colors and a density of a color or colors produced on the photosensitive recording medium due to exposure of the medium to the image radiation. In the present arrangement, the original intensity signal determined so as to obtain the desired quality of image on the viewing screen is modified according to the predetermined relationship between the intensity of the image radiation for the primary color or colors and the density of the corresponding color or colors produced on the photosensitive medium. In other words, the intensity of the image signal applied to the cathode ray tube for reproducing an image on the photosensitive medium is determined so as to provide the cathode ray tube with the optimum luminance that suits the exposure sensitivity of the photosensitive medium, whereby the image reproduced on the medium is given substantially the same color gradation and chromaticity as those of the original image or as observed on the viewing screen. Further, the exposing operations of the photosensitive medium for the three primary colors of light may be concurrently effected, and may even be completed at the same time.

In the above-described form of the present invention wherein the optical path selecting means is provided, the irradiating means may comprise at least one single-color imaging cathode ray tube each having a fluorescent screen which produce a visible image in a corresponding color, and luminance changing means for changing a luminance of each cathode ray tube for the corresponding color to an optimum value for exposure of the photosensitive recording medium by the exposing means so as to produce a nominal density of the corresponding color, if the optical path selecting means is operated from the projecting position to the exposing position.

Where a fluorescent screen is used as the irradiating means, the fluorescent surface of the screen may be coated with a multiplicity of projecting fluorescent elements and a multiplicity of exposing fluorescent elements. The projecting fluorescent elements are adapted to emit projecting beams suitable for a nominal imaging on the viewing screen of the projecting means, while the exposing fluorescent elements are adapted to emit exposing beams suitable for a nominal imaging on the photosensitive recording medium by the exposing means. In this case, first actuator means are provided for selectively actuating the projecting fluorescent elements to emit the projecting beams, and second actuator means are provided for selectively actuating the exposing fluorescent elements to emit the exposing beams. It will be apparent that some of the projecting fluorescent elements may function as some of the exposing fluorescent elements, as long as the projecting and exposing fluorescent elements include different elements that permit the nominal imaging on the viewing screen and the photosensitive medium.

The above arrangement permits an optimum color balance of an image viewed on the viewing screen, and an image formed on the photosensitive medium, since the projecting fluorescent elements are adapted to emit the projecting beams suitable for the sensitivity of the human eyes, while the exposing fluorescent element are adapted to emit the exposing beams that suit the spectral sensitivity of the photosensitive medium. Thus, the projecting and exposing fluorescent elements of a single cathode ray tube can be selectively energized to perform both projecting and copying operations with high image reproducibility. Further, the apparatus is simplified, and the cost of manufacture is reduced.

The second object of the invention described above may be attained according to another form of the invention, wherein the optical guide means comprises splitting means for dividing the image radiation into two parts such that one of the two parts is directed toward one of the projecting means and the exposing means while the other of the two parts is concurrently directed toward the other of the projecting means and the exposing means. In this form of the invention, both the viewing screen and the photosensitive recording medium can be simultaneously irradiated by the image radiation which is split by the splitting means. Consequently, the photosensitive medium can be imagewise exposed to the image radiation from the splitting means while the image represented by the image radiation is being projected on the viewing screen. This feature is appreciated because of a relatively long time required for exposing the photosensitive medium to produce a hard copy of the image projected on the screen, and is particularly useful when the apparatus is used for teaching or lecturing purposes.

According to one arrangement of the above form of the invention, the exposing means comprises a shutter which is movable between a shielding position in which the shutter shields the image radiation from the splitting means, to thereby prevent transmission of the image radiation toward the photosensitive recording medium, and an open position in which the shutter permits transmission of the image radiation from the splitting means toward the recording medium.

According to another arrangement of the above form of the invention, the splitting means comprises a half mirror which reflects the above-indicated one part of the image radiation from the irradiating means toward the above-indicated one of the projecting and exposing means, and transmits the other part of the image radiation therethrough toward the other of the projecting and exposing means.

The third object of the invention described above may be accomplished according to a further arrangement of the same form of the invention stated above, wherein the irradiating means normally produces the image radiation such that the image radiation permits a nominal imaging on the viewing screen of the projecting means, and comprises modifying means for momentarily modifying the image radiation into a modified image radiation for a predetermined duration at a predetermined time interval, such that the modified image radiation is effective to permit a nominal imaging on the photosensitive recording medium due to exposure of the medium to the modified image radiation. The above-indicated duration and time interval are selected so that the modified image radiation will not influence the nominal imaging on the viewing screen as observed by human eyes.

In a further form of the present invention, the irradiating means comprises: a cathode ray tube which produces an image on a fluorescent screen thereof according to source image imformation representative of the original image; input means for entering optical sensitivity data of the photosensitive recording medium; memory means for storing the optical sensitivity data entered through the input means; and source-image modifying means for modifying the source image information supplied to the cathode ray tube, according to the optical sensitivity data stored in the memory means. The present form of the apparatus assures an optimum exposure of the photosensitive recording medium depending upon the optical sensitivity of the medium, which may vary from from one type of the medium to another, and one production lot of the same type of medium to another.

In a still further form of the present invention, the irradiating means comprises a color cathode ray tube having a fluorescent surface which emits visible light in desired colors, a diffusing plate disposed so as to face the fluorescent surface of the cathode ray tube, for diffusing the visible light, and support means for supporting an original bearing the original image, such that the original is exposed to the visible light diffused by the diffusing plate. In the present apparatus, the color of the image reproduced on the recording medium can be adjusted by controlling the colors of the cathode ray tube.

The fourth object of the present invention described above may be accomplished according to another aspect of the invention, which provides an irradiating device for producing a radiation to which a photosensitive recording medium is imagewise exposed to produce a color image on the recording medium, the recording medium bearing on a surface thereof at least two kinds of photosensitive components which are sensitive to the radiation and which produce respective colors with a density which varies with an intensity of the radiation, the irradiating device comprising: signal converting means for converting an original intensity signal representative of a density of each of colors of an original image which correspond to the respective colors produced by the respective at least two kinds of photosensitive components of the photosensitive recording medium, into a modified intensity signal corresponding to a desired density of a corresponding one of the respective colors produced on the photosensitive recording medium due to exposure of the medium to the radiation, according to a relationship between an intensity of the radiation and a density of each of the respective colors produced by the above-indicated at least two kinds of photosensitive components on the medium due to exposure of the medium to the radiation; and optical image forming means for forming optical images corresponding to the at least two kinds of photosensitive components, according to the modified intensity signal. The optical images may be recorded on the medium independently of each other, or superposed on each other so as to form a full-color image.

According to a further aspect of the invention, there is provided an irradiating device for producing a radiation to which a photosensitive recording medium is imagewise exposed, to produce a color image on the recording medium, the recording medium bearing on a surface thereof at least two kinds of photosensitive components which are sensitive to the radiation and which produce respective colors with a density which varies with an intensity of the radiation, wherein the irradiating device comprises: a cathode ray tube including a plurality of electron guns each of which produces a radiation corresponding to each of the above-indicated at least two kinds of photosensitive components, a sensitivity of each of the electron guns to an input signal applied thereto being determined depending upon the density of a corresponding one of the respective colors which is produced due to exposure of a corresponding one of the above-indicated at least two kinds of photosensitive components to the intensity of the radiation produced by each electron gun, such that the density of the corresponding color of the color image produced on the photosensitive recording medium is substantially equal to a density of a corresponding color of an original image.

According to a still further aspect of the invention, there is provided an irradiating device for producing a radiation to which a photosensitive recording medium is imagewise exposed to reproduce an original image, the irradiating device comprising: a cathode ray tube including a fluorescent screen having a fluorescent surface which is coated with a multiplicity of exposing fluorescent elements which emit exposing beams having a wavelength suitable for exposing the photosensitive recording medium to reproduce thereon the original image, and a multiplicity of projecting fluorescent elements which emit projecting beams having a wavelength suitable for projecting the original image on a viewing screen, the cathode ray tube further including exposing electron guns for actuating the exposing fluorescent elements, and projecting electron guns for actuating the projecting fluorescent elements.

According to a yet further aspect of the invention, there is provided an irradiating device for producing a radiation to which a photosensitive recording medium is imagewise exposed to reproduce an original image, the irradiating device comprising: input means for entering optical sensitivity data of the photosensitive recording medium; memory means for storing the optical sensitivity data entered through the input means; source-image modifying means for modifying source image information representative of the original image; and a cathode ray tube having a fluorescent surface which produces a visible image according to the source image information modified by the compensating means.

According to another aspect of the invention, there is provided an irradiating device for imagewise exposing a photosensitive recording medium to reproduce an original image, the irradiating device comprising a color imaging cathode ray tube having a fluorescent surface which emits visible light in desired colors, a diffusing plate disposed so as to face the fluorescent surface of the cathode ray tube, for diffusing the visible light, and support means for supporting an original bearing the original image, such that the original is exposed to the visible light diffused by the diffusing plate, the photosensitive recording medium being exposed to the visible light influenced by the original.

BRIEF DESCRIPTION OF THE DRAWINGS

The foregoing and other objects, features and advantages of the present invention will be better understood by reading the following detailed description of presently preferred embodiments of the invention, when considered in conjunction with the accomapnying drawings, in which:

FIG. 14 is a schematic view showing an arrangement of a cathode ray tube used in a yet further embodiment of the invention;

DETAILED DESCRIPTION OF THE PREFERRED EMBODIMENTS

Figure 1:
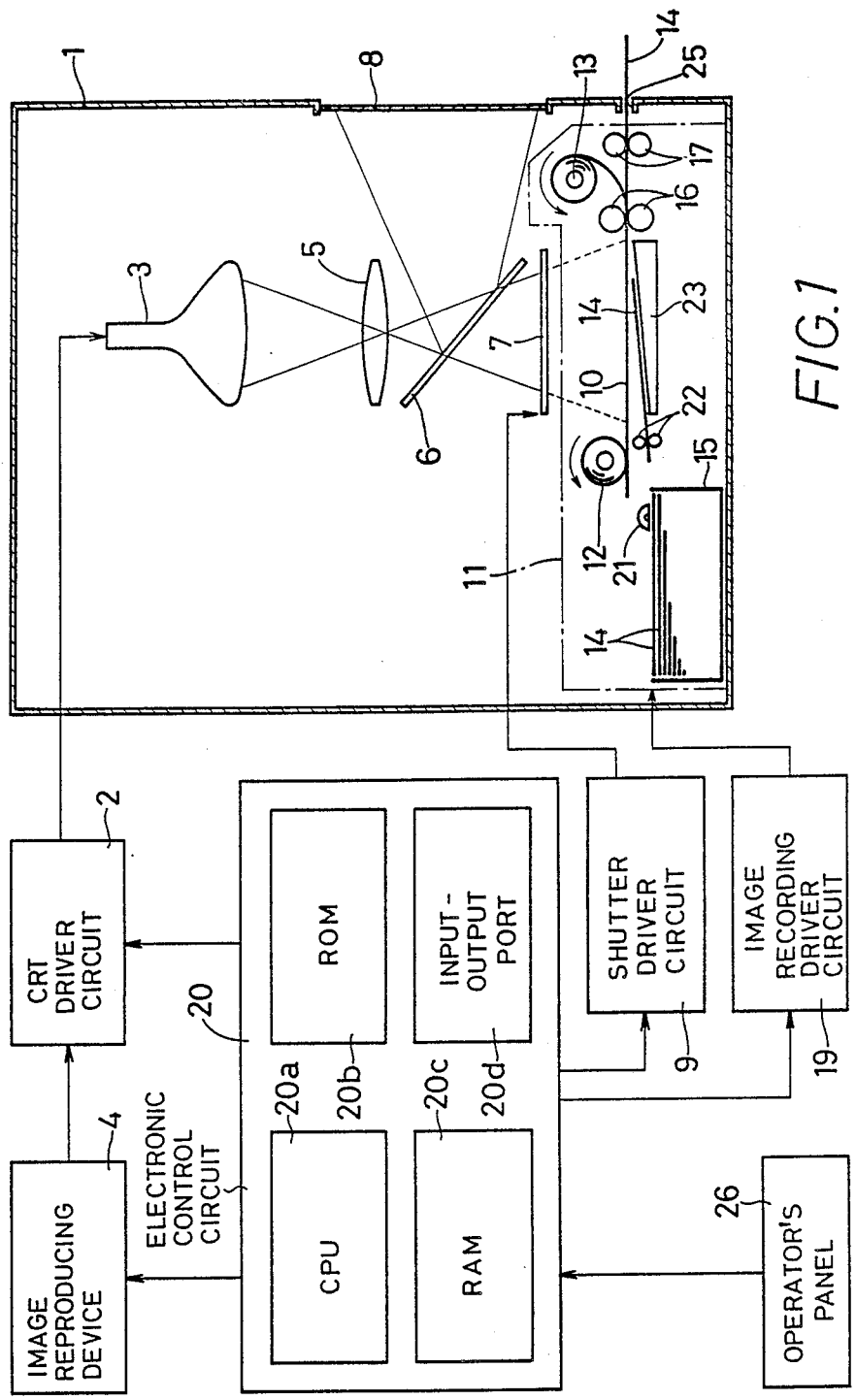
FIG. 1 is a schematic view showing one embodiment of the invention in the form of a color imaging apparatus having a projecting screen, together with an electric control system for the apparatus.

Referring first to the schematic view of FIG. 1, there is shown one embodiment of the present invention in the form of a color imaging apparatus. In the figure, reference numeral 1 designates a main casing having an upper section in which an irradiating device in the form of a full-color imaging cathode ray tube (CRT) 3 is disposed so as to face downward. The CRT 3 is driven by drive signals fed from a CRT driver circuit 2. The driver circuit 2 is connected to an image signal output device in the form of an image reproducing device 4 such as a video disk, so that the driver circuit 2 applies scanning signals to the CRT 3, in response to image signals received from the image reproducing device 4. The CRT driver circuit 2 also receives a color adjusting signal from an electronic control circuit 20 (which will be described), and has a function of modifying the image signals from the image reproducing device 4, in order to adjust or modify an image radiation produced by the CRT 3. The image reproducing device 4 has a function of providing a pause of a color image displayed on a fluorescent screen of the CRT 3, in response to a PAUSE mode signal received from the electronic control circuit 20. The PAUSE mode signal causes the image reproducing device 4 in a PAUSE mode in which a projecting screen 8 continuously presents a given image.

The electronic control circuit 20 consists of a logical operation package whose major components include a central processing unit (CPU) 20a, a read-only memory (ROM) 20b, a random-access memory (RAM) 20c and an input/output port 20d.

Below the color imaging CRT 3, there are disposed a focusing lens 5, beam splitting means in the form of a half mirror 6, and a shutter 7, in the order of description. The image radiation emitted by the CRT 3 is transmitted through the focusing lens 5, and a part of the image radiation is reflected by the half mirror 6 toward the projecting screen 8 which is provided on a side wall of the main casing 1. With the projecting screen 8 irradiated by the image radiation represented by the image signals from the image reproducing device 4, a visible image corresponding to an original image is reproduced on a front surface of the projecting screen 8.

The shutter 7 is operated under the control of the control circuit 20 through a shutter driver circuit 9, between a shielding position (shown in FIG. 1) in a light path leading to an exposing section of the imaging apparatus, and an open position outside the light path. In the shielding position, the shutter 7 shields a part of the image radiation which is transmitted through the half mirror 6 toward the exposing section in which a color imaging pressure-sensitive photosensitive web 10 is disposed. Namely, the shutter 7 placed in its shielding position prevents the photosensitive web 10 from being exposed to the image radiation which has passed the half mirror 6. In the open position, the shutter 7 permits transmission of the image radiation toward the photosensitive web 10.

Below the shutter 7, there is provided an image recording device generally indicated at 11. The recording device 11 includes a supply roll 12 from which the photosensitive web 10 is fed, and a take-up roll 13 on which the used length of the photosensitive web 10 is wound. The device 11 further includes a sheet cassette 15 which accommodates a stack of developer sheets 14. In the present embodiment, the photosensitive web 10 and the developer sheet 14 constitute a photosensitive recording medium.

The pressure-sensitive photosensitive web 10 has a layer of microcapsules formed on one surface of a light-transparent substrate of a synthetic resin film. Each microcapsule contains a chromogenic material or color precursor and a radiation-curable resin. The photosensitive web 10 supplied from the supply roll 12 is fed by the take-up roll 13, such that the web 10 is passed through the exposing section, and through a nip of a pair of presser rolls 16, 16. The web 10 is positioned such that a portion of the web 10 between the supply roll 12 and the presser rolls 16 extends horizontally, and such that the microcapsule layer faces downward. When the horizontal portion of the photosensitive web 10 in the exposing section is imagewise exposed to the image radiation from the color imaging CRT 3, the shutter 7 is moved to its open position. With a suitable time of exposure of the appropriate portion of the photosensitive web 10, the microcapsules in the local areas of the web are selectively hardened or cured, according to the amounts of exposure of the local areas. The developer sheet 14 is superposed on the imagewise exposed portion of the photosensitive web 10, and the superposed sheet and web are passed through the pressure nip between the presser rolls 16. As a result, the uncured microcapsules are ruptured causing the chromogenic material to flow out of the ruptured capsules, whereby the chromogenic material of the uncured microcapsules chemically reacts with a developer material of a developing layer of the developer sheet 14. The chemical reaction between the chromogenic material and the developer material produces a color image corresponding to the image radiation emitted by the CRT 3. While the exposed portion of the web 10 is wound on the take-up roll 13, the developer sheet 14 is passed through a nip of a pair of heater or fixing rolls 17, 17 which are disposed to the right of the presser rolls 16 (as seen in FIG. 1). Thus, the visible color image formed on the developer sheet 14 is fixed.

The image recording device 11 is operated under the control of the electronic control circuit 20, through an image recording driver circuit 19. When the control circuit 20 receives a START signal from an operator's panel 26, the image recording device 11 is started. Initially, a semi-cylindrical feed roller 21 disposed above the sheet cassette 15 is rotated to deliver the uppermost developer sheet 14 from the cassette 15 in a rightward direction, so that the sheet 14 is fed on a sheet guide 23 by a pair of transfer rolls 22, 22 located below the supply roll 12. When the leading edge of the developer sheet 14 reaches the nip of the presser rolls 16, 16, the take-up roll 13 and the presser rolls 16 are rotated, whereby the superposed developer sheet 14 and photosensitive web 10 are fed rightward through the nip of the presser rolls 16, such that the developer sheet 14 is pressed against the lower surface of the exposed portion of the web 10. The exposed portion of the web 10 is wound on the take-up roll 13, while the developed image on the developer sheet 14 is fixed by heat by the fixing rolls 17. The developer sheet 14 which has passed between the fixing rolls 17 is discharged out of the imaging apparatus, through an exist formed through the main casing 1.

In the imaging apparatus constructed as described above, desired source or original images stored in a video disk, for example, may be reproduced on the projecting screen 8. Accordingly, the instant apparatus may be used for teaching or lecturing purposes, with the desired images being presented on the projecting screen 8. If the START signal is fed from the operator's panel 26 to the control circuit 20 while a desired image is presented on the screen 8, the image recording device 11 is activated to record the same image on the developer sheet 14. Since part of the image radiation emitted by the CRT 3 is reflected by the half mirror 6 toward the projecting screen 8, the image which is being recorded by the recording device 11 can be viewed on the projecting screen 8.

The pressure-sensitive photosensitive web 10 used in the present embodiment has a lower degree of exposure sensitivity to red rays of the image radiation, than to blue and green rays. Therefore, it is necessary to adjust or modify the image radiation generated by the CRT 3, depending upon the optical sensitivity characteristic of the photosensitive web 10, for obtaining a nominal color imaging on the developer sheet 14.

Referring next to the flow chart of FIG. 2, there will be described an image recording routine executed by the electronic control circuit 20, which includes an operation to adjust the image radiation as indicated above.

This routine is executed when the START signal is fed from the operator's panel 26 to the electronic control circuit 20 while an image stored in a video disk or other storage medium is reproduced on the projecting screen 8 with the image reproducing device 4 held in its operated state.

Figure 2:
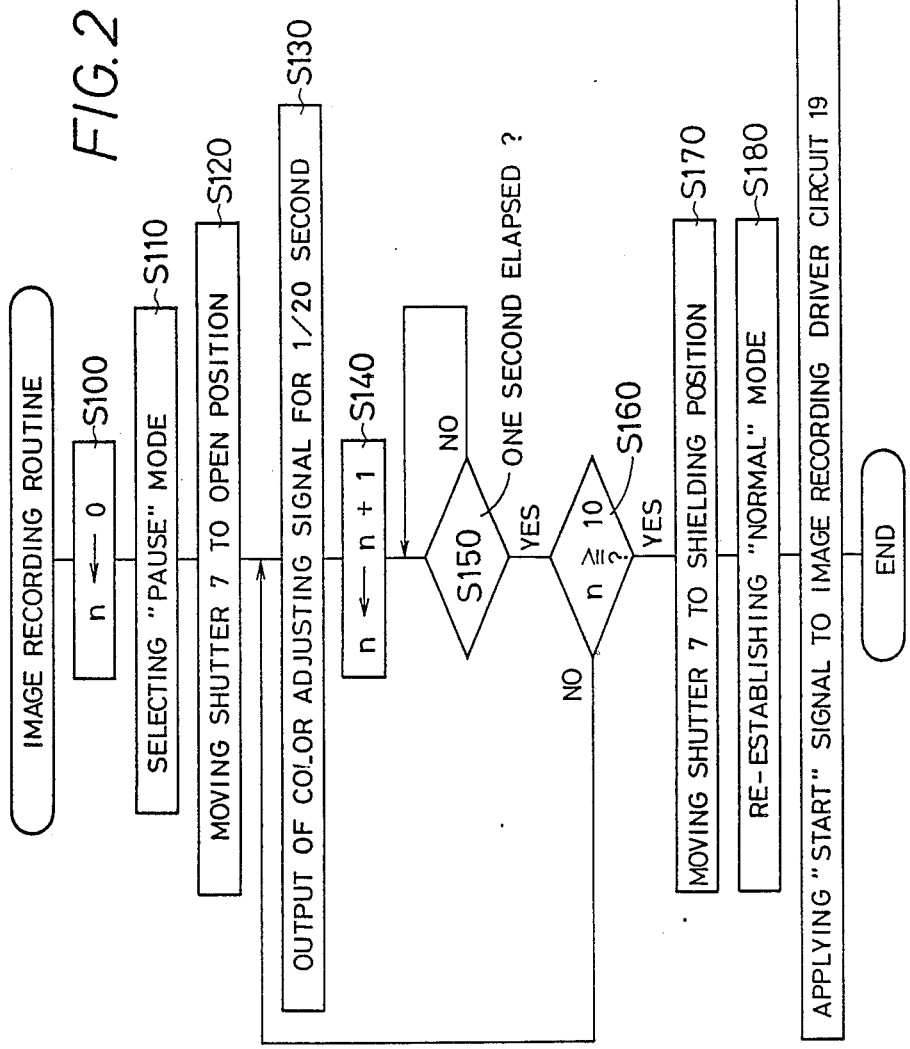
FIG. 2 is a flow chart showing an image recording routine executed by an electronic control circuit of the control system.

As indicated in the flow chart of FIG. 2, the routine begins with step S100 in which a counter in the CPU 20a is cleared. The control flow then goes to step S110 in which the image reproducing device 4 is placed in the PAUSE mode. As a result, a currently displayed color image on the fluorescent screen of the CRT 3, that is, an image radiation emitted by the CRT 3 is maintained. In the next step S120, the control circuit 20 applies a signal to the shutter driver circuit 9, to move the shutter 7 to the open position for permitting the image radiation to be transmitted to the exposing section of the image recording device 11.

Subsequently, the control flow goes to step S130 in which the control circuit 20 applies a color adjusting signal to the CRT driver circuit 2 for a time span of one-twentieth of a second, so that the red rays of the image radiation produced by the CRT 3 are intensified for the same time span of one-twentieth of a second. Then, in step S140, the counter of the CPU 20a is incremented. Step S140 is followed by step S150.

In step S150, the CPU 20a determines whether one second has elapsed after the generation of the color adjusting signal in step S130. If the determination in step S150 indicates that one second has elapsed (if an affirmative decision is obtained), the control flow goes to step S160 to determine whether the content of the counter reaches "10", or not. If the content is smaller than "10", the control flow goes back to step S130. Steps S130, S140, S150 and S160 are repeatedly implemented until the content of the counter becomes equal to "10".

It will be understood that the red rays of the image radiation emitted by the CRT 3 are intensified for a predetermined time duration of 1/20 second at a predetermined time interval of one second, as a result of execution of steps S130–S160, which are repeated for 10 seconds.

If the content of the counter of the CPU 20a reaches "10" in step S160, the control flow goes to step S170 to move the shutter 7 to its shielding position, and then step S180 in which the image reproducing device 4 or CRT driver circuit 2 is restored from the "PAUSE" mode to the "NORMAL" mode. Step S180 is followed by step S190.

In step S190, the START signal is applied to the image recording driver circuit 19, to activate the image recording device 11. The instant image recording routine is ended when the operation of the recording device 11 is terminated.

More specifically, a series of image recording operations of the recording device 11 is effected in step S190, to reproduce on the developer sheet 14 the same image as viewed on the projecting screen 8. The developer sheet 14 bearing the recorded image is delivered from the exit 25 of the apparatus.

In the present color imaging apparatus, the photosensitive web 10 which has a comparatively low degree of sensitivity to red rays of the image radiation is sufficiently exposed to the red rays, since the red rays are intensified through the repeated execution of steps S130–S160. Accordingly, the image to be formed on the developer sheet 14 is given a well balanced color tone. In this connection, it is noted that the part of the image radiation irradiating the projecting screen 8 is also modified with respect to the intensity of the red rays, for the predetermined time duration of 1/20 second at the predetermined time interval of one second, due to steps S130–S160 executed during the exposing operation on the photosensitive web 10. However, the momentarily modified color tone on the projecting screen 8 cannot be perceived as an afterimage by human eyes, since the time duration of the intensity modification is only a fraction of a second, namely, as short as 1/20 second. Therefore, the image reproduced on the projecting screen 8 is perceived as if the intensity modification of the red rays of the image radiation from the CRT 3 were not effected.

Although the instant image recording routine is adapted to intensify the red rays of the image radiation for 1/20 second at a time interval of one second, the time duration of the intensity modification of the red rays may be changed as needed, within a range of 1/30 to 1/20 second per one-second exposure of the photosensitive web 10. Further, the time interval of the intensity modification is not limited to one second as practiced in the illustrated embodiment. However, if the time interval is too short, the afterimage corresponding to the non-modified rays of the image radiation tends to be reduced, and the color tone on the projecting screen 8 as perceived by human eyes may be deteriorated. If the time interval is extremely longer than one second, the required exposing time of the photosensitive web 10 will increase, unfavorably lowering the image recording efficiency.

In the illustrated embodiment, the projecting screen 8 displays the image even while the image recording device 11 is operated, because of the use of the half mirror 6 which reflects a half of the image radiation from the CRT 3 toward the projecting screen 8 and transmits the other half of the image radiation. Thus, the instant imaging apparatus is free from a conventionally experienced problem that the image disappears from the projecting screen when the image recording operation is started.

While the CRT 3 is used as the full-color irradiating device for irradiating the projecting screen 8 and the photosensitive web 10, the CRT 3 may be replaced by a video projector or a liquid crystal display device.

The image reproducing device may be a video tape reproducing device, rather than a video disk as described above as an example. Further, image signals from a TV tuner may be utilized to actuate the CRT 3. In this case, the image signals from the TV tuner are temporarily stored in the RAM 20c of the control circuit 20.

In the above embodiment, the pressure-sensitive photosensitive web 10 and the separate developer sheet 14 are used as a color imaging photosensitive recording medium. However, it is possible to modify the developer sheet 14 such that the sheet 14 also has a microcapsule layer so that the chromogenic material coming out of the ruptured microcapsules may chemically react with the developing material of the developer layer.

Figure 3:
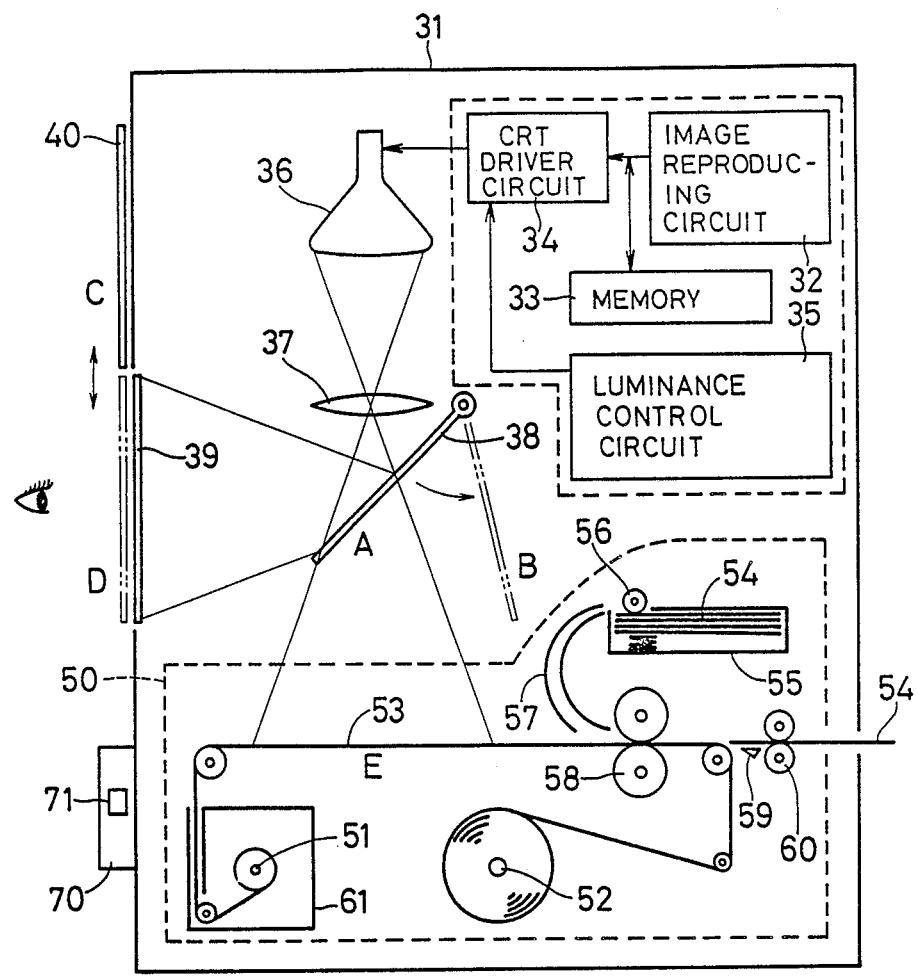
FIG. 3 is a schematic view of another embodiment of the invention.

Referring to FIG. 3, a modified color imaging apparatus is generally indicated at 31. This apparatus also incorporates a projector device which will be described. The imaging apparatus 31 incorporates: an image reproducing circuit 32 which generates image signals or source image information representative of an original image to be reproduced; a memory 33 for storing the image signals; a driver circuit 34 which is capable of adjusting intensities of its output color signals corresponding to three primary colors of light (blue, green and red); and a luminance control circuit 35 which serves as luminance changing means for adjusting the intensities of the color signals applied from the driver circuit 34 to a CRT 36, in order to adjust the luminances of the CRT 36. While the apparatus 1 incorporates other circuits, no description thereof is deemed necessary to understand the principle of the invention.

The CRT 36, which serves as an irradiating device, is disposed so as to face downward. Below the CRT 36, there is provided a focusing lens 37 such that the lens 37 faces a fluorescent screen of the CRT 36. Below the focusing lens 37, there is disposed a reflecting mirror 38 which is pivotable between a PROJECTOR position A indicated in solid line, and a COPIER position B indicated in broken line.

On the left-hand side wall of the housing of the apparatus 31, there is provided a projecting screen 39, which may be covered by a screen cover 40. The cover 40 is movable between a non-operated position C indicated in solid line, and an operated position D indicated in broken line.

Below the reflecting mirror 38, there is disposed a copying or image recording device generally indicated at 50. The copying device 50 uses a pressure-sensitive photosensitive web or sheet 53 (as disclosed in U.S. Pat. No. 4,399,209), which is threaded so as to extend between a supply roll 51 and a take-up roll 52. The web 53 has a layer of microcapsules as described above. When the mirror 38 is placed in the COPIER position B indicated in broken line, an image produced on the CRT 36 is focused by the lens 37, on an exposing section of the copying device 50 indicated at E. Namely, a portion of the photosensitive web 53 positioned in the exposing section E is imagewise exposed to the image radiation emitted by the CRT 36.

The copying apparatus 50 further includes a sheet cassette 55 which accommodates a stack of developer sheets 54. The sheets 54 are delivered from the cassette 55 by a feed roller 56, and is fed toward a path of the photosensitive web 53, while being guided by a guide 57. The delivered developer sheet 54 is superposed on the imagewise exposed portion of the photosensitive web 53, and the superposed developer sheet 54 and web 53 are passed through a pressure nip of a developing device in the form of a pair of presser rolls 58, 58. Thus, a latent image formed on the imagewise exposed portion of the web 53 is developed under pressure into a visible image on the developer sheet 54, in the manner as described above with respect to the photosensitive web 10 and developer sheet 14 used in the preceding embodiment. The portion of the web 53 which has passed the presser rolls 58 is separated by a separator 59 from the developer sheet 54, and is wound on the take-up roll 52. The visible image formed on the developer sheet 54 is fixed by heat by a fixing device in the form of a pair of heater rolls 60. The unused length of the photosensitive web 53 is accommodated as the supply roll 51 received in a cartridge 61. In the present embodiment, too, the photosensitive web 53 and the developer sheet 54 constitute a pressure-sensitive photosensitive recording medium.

To the outer wall of the apparatus 1, there is attached an operator's panel 70 which has a HARD COPY switch 71 used to activate the copying device 50 to reproduce a desired image on the developer sheet 54 as described above.

An operation of the present imaging apparatus will be described. When the imaging apparatus is used as a projector, the mirror 38 is placed in the PROJECTOR position A indicated in solid line in FIG. 3, and the screen cover 40 is placed in the non-operated position C indicated in solid line. An image is produced on the CRT 36 according to the image signals received from the CRT driver circuit 34. As a result, an image radiation corresponding to the image on the CRT 36 travels through the focusing lens 37 and is reflected by the mirror 38, whereby an image represented by the reflected image radiation is formed on the projecting screen 39. In this condition, the operator may check the output level or luminances of the CRT 36, by observing the image on the projecting screen 39.

Described more specifically, the luminances of three primary colors of light, i.e., red (R), green (G) and blue (B), of the CRT 36 are determined to obtain a nominal color tone as provided on an ordinary cathode ray tube, and are suitable for projecting an image on the screen 39.

Where it is desired to produce a hard copy of a certain image by exposing the photosensitive recording medium 53, 54, the HARD COPY switch 71 on the operator's panel 70 is pressed. With this operation, the currently active image signals are stored in the memory 33, and an operation to reproduce the corresponding image is started on the copying device 50.

Initially, the display on the CRT 36 is interrupted, and the screen cover 40 is moved by a suitable mechanism (not shown) from its non-operated position C to its operated position D, in order to block external rays. Then, the reflecting mirror 38 is pivoted by a suitable mechanism (not shown) from the PROJECTOR position A to the COPIER position B.

Subsequently, the image signals stored in the memory 33 are applied to the CRT 36 through the driver circuit 34, whereby an image represented by the image signals is produced on the CRT 36.

Figure 4:
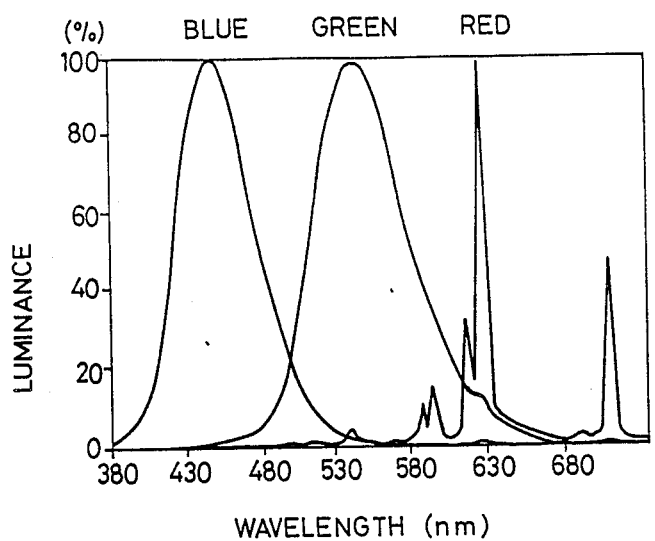
FIG. 4 is a view indicating light emitting characteristic of fluorescent elements of a cathode ray tube used in a color imaging apparatus of FIG. 3.

The graph of FIG. 4 shows a relationship between the luminance values of the CRT 36 for the three primary colors of light and a wavelength of the corresponding blue, green and red rays. The graph indicates the following characteristics of the CRT 36 in terms of the luminance values in relation to the wavelength of the image radiation:
(1) The peak wavelengths of the blue, green and red rays to give the maximum luminance values of the CRT 36 are 450 nm, 550 nm and 630 nm, respectively. It is noted that the peak wavelength of the red rays is 610 nm on some types of cathode ray tube.
(2) The wavelength band of the red rays in which the CRT 36 provides an effective value of luminance of the red color is comparatively narrow.

Figure 5:
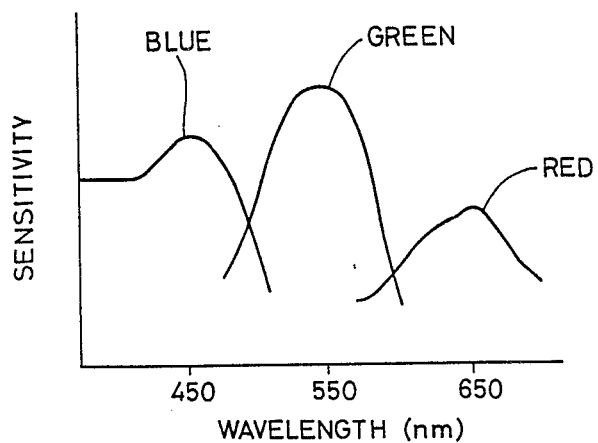
FIG. 5 is a view indicating exposure sensitivity of a photosensitive recording medium.

The graph of FIG. 5 shows a relationship between the sensitivity of the photosensitive web 53 (density of colors produced on the web) and the wavelength of the blue, green and red rays of the image radiation emitted by the CRT 36. The graph indicates the following characteristics of the web 53:
(1) The peak wavelength of the red rays is 650 nm.
(2) The sensitivity of the web 53 to the red rays is comparatively low.

Thus, the luminance characteristics of the CRT 36 with respect to the wavelengths of the blue, green and red rays are different from the light optical sensitivity characteristics of the photosensitive web 53. Therefore, if the luminance values of the three primary colors of light of the CRT 36 that are determined to provide a nominal imaging on the projecting screen 39 are applied to the exposure of the photosensitive web 53, the color balance of the image reproduced on the developer sheet 54 differs from that of the image on the projecting screen 39 viewed by the operator.

In view of the above, when an image is reproduced by the copying device 50, the luminance adjusting signal is applied from the luminance control circuit 35 to the driver circuit 34, so that the gains of the driver circuit 34 for the three primary colors of light are suitably adjusted or modified so as to provide an optimum color balance of the complementary colors (cyan, magenta and yellow) of the three primaries, which are produced on the photosensitive recording medium 53, 54. In the present specific example, the luminance control circuit 35 supplies the driver circuit 34 with a luminance adjusting signal so that the intensity of the red color signal applied to the CRT 36 is considerably increased so as to increase the luminance of the red color of the CRT 36. Further, the luminance control circuit 35 also produces a luminance adjusting signal which slightly intensify the luminance of the blue color of the CRT 36.

The amount of adjustment of the luminances of the CRT 36 during operation of the copying device 50 depends upon the type of the CRT 36, and the type of the photosensitive recording medium 53, 54.

After the relevant portion of the photosensitive web 53 is imagewise exposed to the thus adjusted modified image radiation from the CRT 36, the web 53 is fed to the right by the take-up roll 52, while at the same time the uppermost developer sheet 54 is delivered by the feed roller 56 from the cassette 55, and fed through the guide 57, such that the sheet 54 is superposed on the exposed portion of the web 53 before the latent image on the web 53 is pressure-developed by the developing device 28, into a visible image on the developer sheet 54. The used portion of the web 53 and the developed developer sheet 54 are separated from each other by the separator 59, and the used portion of the web 53 is wound on the take-up roll 52, while the developer sheet 54 is passed through the nip of the fixing device 60, for fixing and lustering the developed image. The developer sheet 54 is then discharged out of the apparatus 31.

After the image is reproduced on the developer sheet 54, the mirror 38 is restored to the PROJECTOR position A, and the screen cover 40 is moved from the operated position D to the non-operated position C. Further, the luminance control circuit 35 applies to the driver circuit 34 luminance control signals that permit the CRT 36 to provide a nominal color balance. As a result, the original image represented by the color signals from the driver circuit 34 is reproduced on the projecting screen 8, with a suitable color balance. With the cover 40 located at the non-operated position C, the imaging apparatus 31 is used as a projector.

Thus, the luminance control circuit 35 functions as means for changing the luminance of the CRT 36 for the red and blue colors of the three primary colors of light to an optimum value for exposure of the photosensitive recording medium 53, 54, when the mirror 38 is moved from the PROJECTOR position to the COPIER position.

While the present embodiment uses the reflecting mirror 38 as optical path selecting means for directing the image radiation selectively to the photosensitive web 53 or to the projecting screen 39, the mirror 38 may be replaced by a half mirror as used in the preceding embodiment. In this case, a shutter may preferably be provided to prevent exposure of the photosensitive web to the image radiation, as needed.

Referring to FIGS. 6-10, there will be described another type of luminance changing device for a color imaging cathode ray tube used as an irradiating device for exposing a photosensitive recording medium whose microcapsules are softened upon exposure to a radiation.

Figure 6:
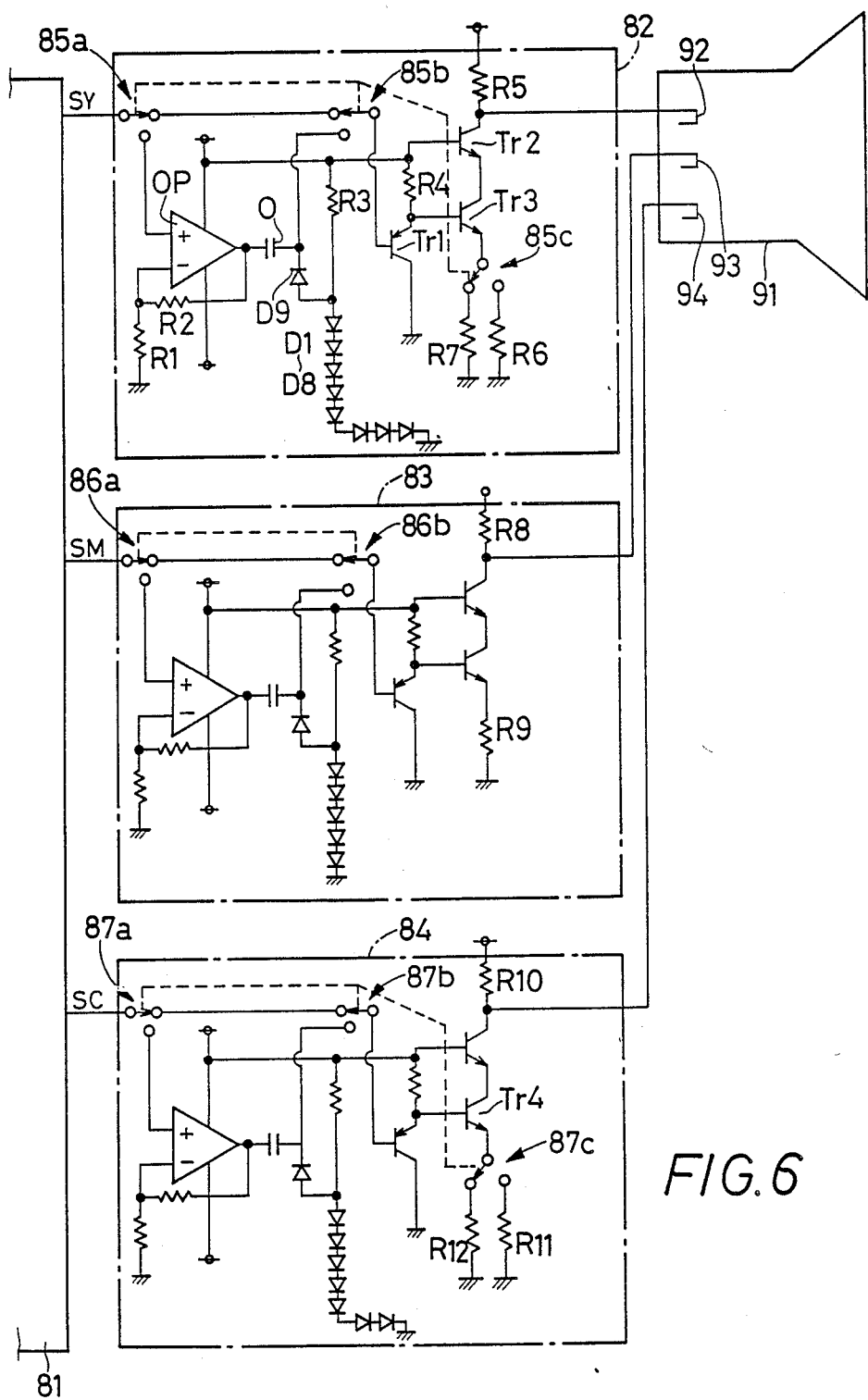
FIG. 6 is a schematic view showing a further embodiment of the present invention which incorporates a modified arrangement for changing the luminances of a full-color imaging cathode ray tube.

FIG. 6 shows an irradiating arrangement for exposing a photosensitive recording medium to reproduce a color image, i.e., a combination of yellow, magenta and cyan images. The irradiating arrangement includes a control device 81 which produces color intensity signals SY, SM and SC representative of the yellow, magenta and cyan images to be reproduced, and three driver circuits 82, 83 and 84 which receive the color intensity signals SY, SM, SC from the control device 81. These driver circuits 82, 83, 84 drive a full-color imaging cathode ray tube (hereinafter referred to as "color CRT 91). The color CRT 91 incorporates electron guns 92, 93 and 94 for the yellow, magenta and cyan images. As described below, each driver circuit 82, 83, 84 incorporates luminance changing means for the corresponding electron gun 92, 93, 94. The luminance changing means is activated when the instant irradiating arrangement is used to reproduce a desired image on the photosensitive recording medium.

The control device 81 is a circuit which processes an original color image to prepare yellow, magenta and cyan images by way of color separation, and supplies the respective driver circuits 82, 83, 84 with the corresponding yellow, magenta and cyan color intensity signals SY, SM, SC. The driver circuits 82, 83, 84 are capable of converting the received color intensity signals SY, SM, SC into modified color intensity signals, which are applied to the color CRT 91 when the radiation emitted by the CRT 91 is used to expose the photosensitive recording medium.

The driver circuit 82 includes: an operational amplifier OP connected to resistors R1, R2 to perform a non-reversible amplifying operation; a coupling capacitor O; three transistors Tr1, Tr2, Tr3 which cooperate with resistors R4, R5, R6, R7 to constitute a cathode drive circuit; eight diodes D1-D8 which are connected in series with each other and which determine a dc component of an input signal to the cathode drive circuit; and a diode D9 for preventing a current flow in a predetermined direction. The operational amplifier OP is a preamplifier which provides an amplification degree of "2". The current amplification factors of the transistors Tr1-Tr3 and the resistances of the resistors R4, R5 and R6 are determined such that the overall amplification degree of the cathode drive circuit Tr1-Tr3 and R4-R6 is "−20".

The driver circuit 82 has three change-over switches 85a, 85b, 85c which are interlocked with each other. These changeover switches 85a, 85b, 85c are placed in the positions of FIG. 6 when the instant arrangement is used to project an image on a suitable projecting screen as used in the preceding embodiments. In this position, the intensity signal SY for the yellow image (yellow intensity signal) produced by the control device 81 is applied directly to the transistor Tr1, through the switches 85a and 85b, and the transistor Tr3 is connected to the resistor R7 through the switch 85c.

The driver circuit 83 has two change-over switches 86a and 86b which are placed in the position of FIG. 6 when the instant arrangement is used to project an image. In this position, the magenta intensity signal is applied directly to the cathode drive circuit of the driver circuit 83 which includes resistors R8 and R9. The driver circuit 84 has three change-over switches 87a, 87b and 87c which correspond to the change-over switches 85a, 85b and 85c of the driver circuit 82. The cathode drive circuit of the driver circuit 84 includes resistors R10, R11 and R12. Like the transistor Tr3 of the driver circuit 82, a transistor Tr4 of the driver circuit 84 is selectively connected to the resistors R11 and R12 through the change-over switch 87c.

The resistance values of the resistors R5, R7, R8, R9, R10 and R12 are determined such that the ratio of the resistance of the resistor R5 to that of the resistor R7, and the ratio of the resistance of the resistor R10 to that of the resistor R12 are equal to the ratio of the resistor R8 to that of the resistor R9 (R8/R9=R5/R7=R10/R12). Thus, the ratio of the resistance of the resistor R8 to that of the resistor R9 of the driver circuit 83 for the magenta image is used as a reference value to determine the amplification degrees of the cathode drive circuits of the driver circuits 82 and 84 when the change-over switches 85a-85c, 86a, 86b and 87a-87c are placed in the positions for projecting an image on a screen.

The operation of the driver circuit 82 will be described. The level of this yellow intensity signal SY varies between 1 V and 2 V. When the level of the signal SY is 1 V, the density of a yellow color produced on the photosensitive medium due to exposure to the radiation emitted from the color CRT 91 is 0%. That is, no yellow color is produced. When the level of the signal SY is 2 V, the density of the produced yellow color is 100%.

When the instant irradiating arrangement is used to reproduce a color image on a photosensitive medium, the change-over switches 85a, 85b, 85c of the driver circuit 82 are operated from the position of FIG. 6 to the other position, whereby the yellow intensity signal SY is applied to an input of the operational amplifier OP, and the capacitor 0 is connected to the transistor Tr1. Further, the transistor Tr3 is connected to the resistor R6, so that the luminance changing means of the driver circuit 82 is rendered operable, with the amplification degree of the cathode drive circuit being set at "−20". Similarly, the switches 86a, 86b, and 87a, 87b and 87c of the driver circuits 83 and 84 are operated from the position of FIG. 6 to the other position, to place the luminance changing means of these driver circuits in the operable state. Like the transistor Tr3 of the driver circuit 82, the transistor Tr4 of the driver circuit 84 is connected to the resistor R11 through the change-over switch 87c.

When the luminance changing means of the driver circuit 82 is placed in the operable state with the switch 85a connected to the operational amplifier OP, the yellow intensity signal SY is two-time amplified by the preamplifier OP in a non-reversible manner, and is applied to the cathode drive circuit Tr1, Tr2, Tr3, and R4-R6, through the capacitor O and the switch 85b.

The input of the cathode drive circuit (i.e., base of the transistor Tr1) is loaded with an offset voltage corresponding to a voltage drop by the diodes D1–D8. The level of the yellow intensity signal applied to the transistor Tr1 varies by a maximum of 2 V [$=2\times(2\,V-1\,V)$], with respect to the offset potential applied thereto.

As described above, the current amplification factors of the transistors Tr1–Tr3 and the resistances of the resistors R4–R6 of the cathode drive circuit are determined so that the overall amplification degree of the cathode drive circuit is equal to "$-20$". If the offset potential at the transistor Tr1 is 100 V, the output voltage (cathode potential) of the driver circuit 82 for the yellow image varies between 60 V and 100 V, as the level of the yellow intensity signal SY is changed between 1 V and 2 V, as indicated in solid line in the graph of FIG. 7.

Figure 8:
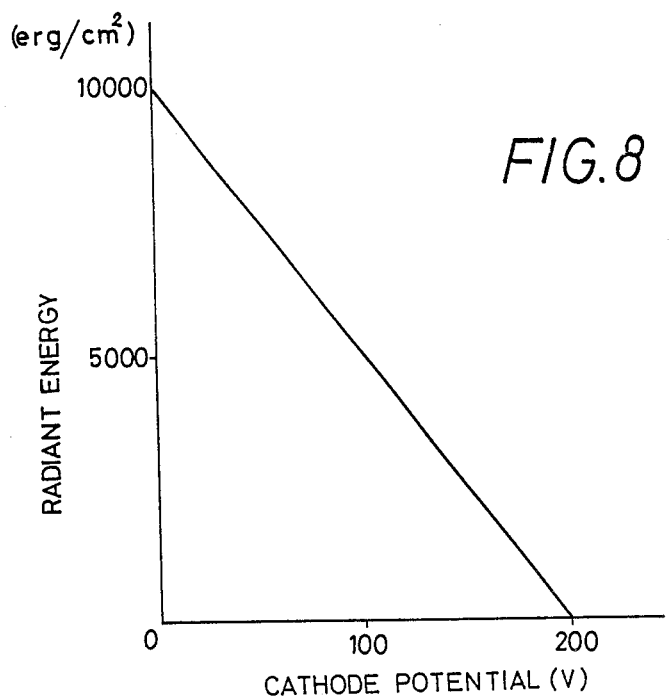
FIG. 8 is a graph illustrating a relationship between the cathode potential and the radiant energy of the cathode ray tube.

Accordingly, the radiant energy of the electron gun 92 for the yellow image varies between 5,000 and 7,000 erg/cm$^2$, as the cathode potential varies between 60 V and 100 V, as indicated in the graph of FIG. 8, which shows that the radiant energy and the cathode potential have a substantially linear relationship.

The driver circuit 83 for the magenta image is identical with the driver circuit 82, except that the amplification degree of the operational amplifier of the driver circuit 83 is "1.5", and that the offset potential of the cathode drive circuit of the driver circuit 83 is 140 V. Accordingly, the cathode potential of the driver circuit 83 varies between 110 V and 140 V as the magenta intensity signal is changed between 1 V and 2 V, whereby the radiant energy of the electron gun 93 for the magenta image varies between 3,000 and 4,500 erg/cm$^2$, as indicated in one-dot chain line in FIG. 7.

The amplification degree of the operational amplifier and the offset potential of the driver circuit 84 for the cyan image are "4" and 120 V, respectively. Accordingly, the cathode potential varies between 120 V and 40 V with a change in the level of the cyan intensity signal from 1 V to 2 V, whereby the radiant energy of the electron gun 94 varies between 4,000 and 8,000 erg/cm$^2$, as indicated in dashed line in FIG. 7.

In the instant irradiating arrangement adapted to project a color image or expose a photosensitive medium, a change in the level of the yellow, magenta and cyan intensity signals will cause a linearly proportional increase in the radiant energies of the electron guns 92, 93, 94 for the yellow, magenta and cyan images, from the minimum level (5,000 erg/cm$^2$ for yellow, 3,000 erg/cm$^2$ for magenta, 4,000 erg/cm$^2$ for cyan at which the density of the produced colors is 0%), up to the maximum level (7,000 erg/cm$^2$ for yellow, 4,500 erg/cm$^2$ for magenta, 8,000 erg/cm$^2$ for cyan at which the density of the produced colors is 100%).

Figure 9A:
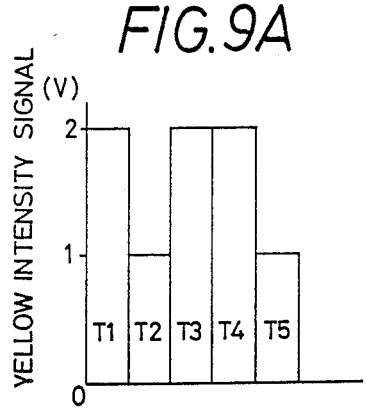
FIGS. 9(A), 9(B) and 9(C) are graphs showing examples of intensity signals applied to the cathode ray tube for three primary colors of light to produce three complementary colors of the three primary colors of light.
Figure 9B:
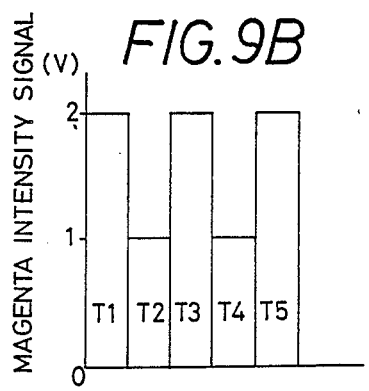
Figure 9C:
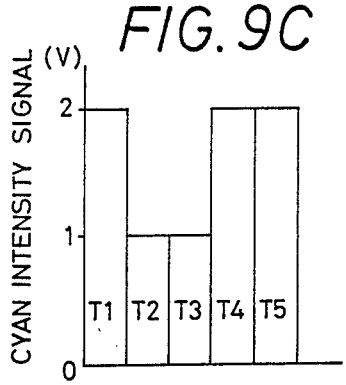
Figure 10A:
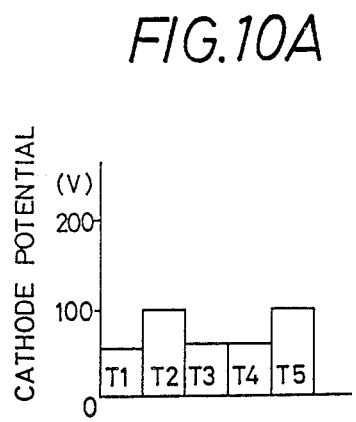
FIGS. 10(A), 10(B) and 10(C) are graphs showing the cathode potentials of the cathode ray tube which correspond to the intensity signals shown in FIGS. 9(A), 9(B) and 9(C)
Figure 10B:
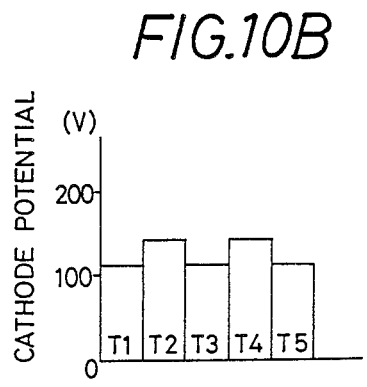
Figure 10C:
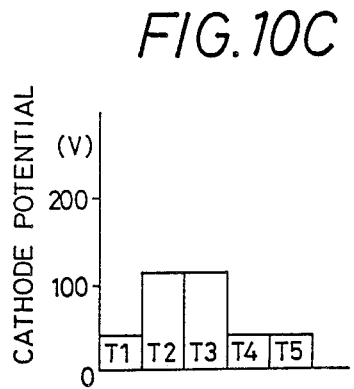

For instance, if the level of the yellow, magenta and cyan intensity signals is changed from 2 V to 1 V or vice versa at points of time T1–T5, as indicated in FIGS. 9(A), 9(B) and 9(C), the cathode potential of the yellow electron gun 92 is changed from 60 V to 100 V or vice versa, while the cathode potential of the magenta electron gun 93 is changed from 110 V to 140 V or vice versa, as indicated in FIGS. 10(A) and 10(B). Similarly, the cathode potential of the cyan electron gun 94 is changed from 40 V to 120 V or vice versa, as indicated in FIG. 10(C). Therefore, the density of the corresponding yellow, magenta and cyan colors produced on the photosensitive medium due to exposure thereof to the image radiation emitted from the CRT 91 is changed in direct proportion with the level of the respective intensity signal produced by the control device 81, whereby the gradation and chromaticity of the reproduced color image are substantially identical with those of the original image.

In the present embodiment, the electron guns 92, 93, 94 are driven according to the exposure sensitivity of the respective chromogenic materials or photosensitive components of the photosensitive medium, so that the imagewise exposing operations of the photosensitive medium for the yellow, magenta and cyan images (which are combined to produce a color image) can be concurrently performed and completed within a given length of time.

Figure 11:
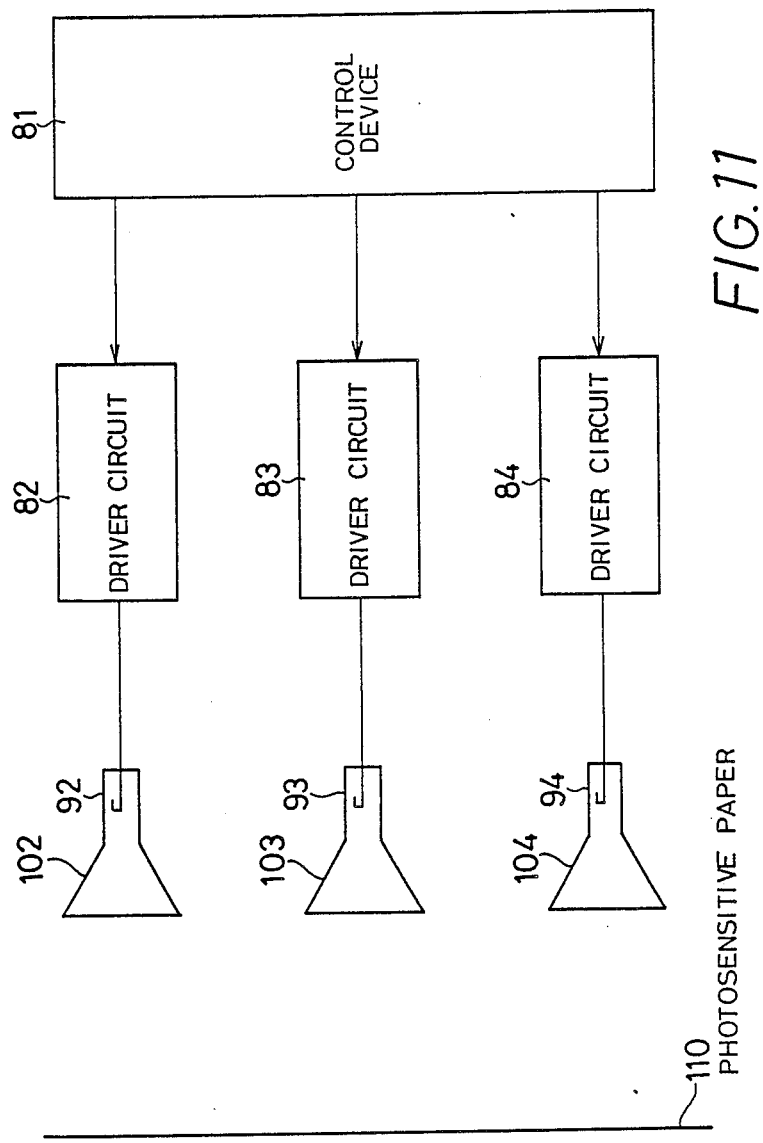
FIG. 11 is an illustration showing a still further embodiment of the present invention.

A modification of the irradiating arragement of FIG. 6 is schematicaly shown in FIG. 11, wherein the yellow, magenta and cyan intensity signals are applied to three separate, cathode ray tubes 102, 103 and 104 for yellow, magenta and cyan images, respectively, through the respective driver circuits 82, 83 and 84. In this case, for example, a photosensitive recording medium 110 is imagewise exposed to three image radiations emitted by the three cathode ray tubes, at different times, so that yellow, magenta and cyan images formed by the sensitized photosensitive pigments are combined to produce a full-color image. Where the cathod ray tubes 102, 103 and 104 are used to irradiate a viewing screen, the yellow, magenta and yellow radiations are focused concurrently on the viewing screen so that a full-color image is produced on the screen. Further, the three radiations may be focused concurrently on the photosensitive medium, through a suitable optical system.

Figure 12:
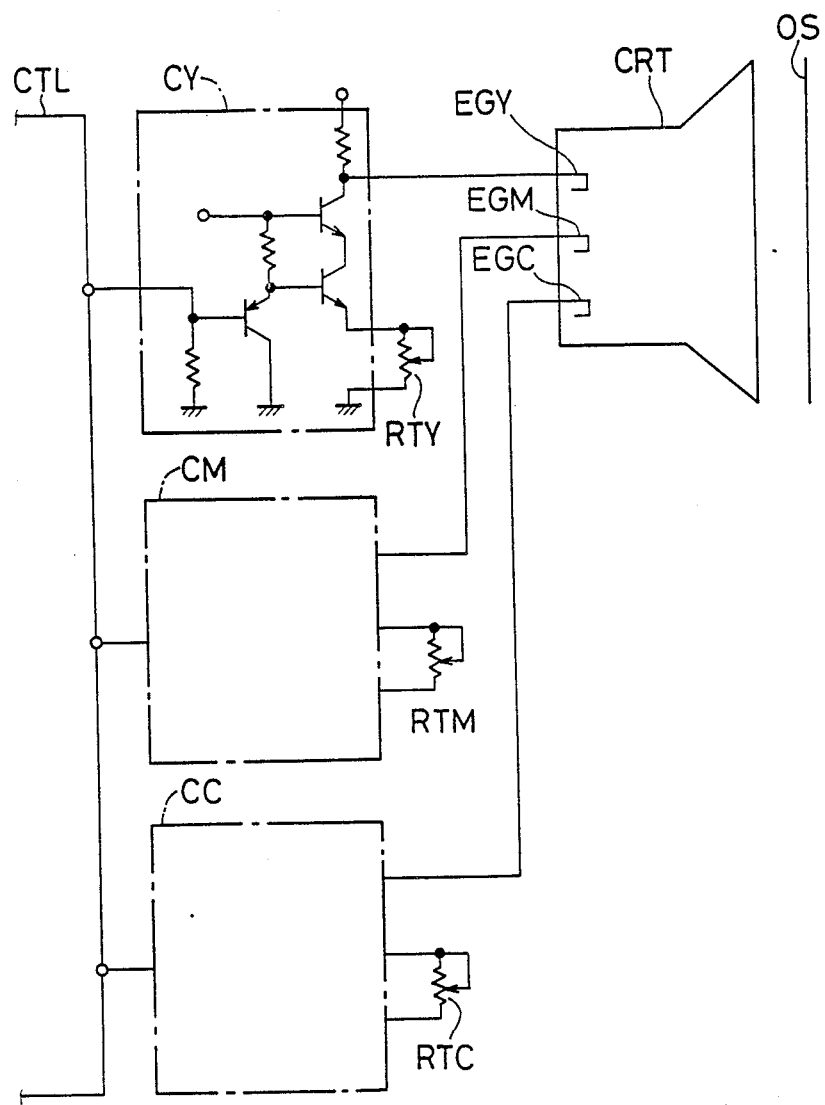
FIG. 12 is a block diagram showing a known exposing or irradiating device for an imaging apparatus.

The above embodiments of FIGS. 6 and 11 using the driver circuits 82, 83 and 84 are improved over a known arrangement shown in FIG. 12 wherein electron guns EGY, EGM and EGC of a color CRT for yellow, magenta and cyan images are driven by driver circuits CY, CM and CC, so that a photosensitive paper OS is exposed to an image radiation produced by the electron guns EGY, EGM and EGC. In this conventional arrangement, signals produced by a controller CTL and applied to the driver circuits CY, CM and CC should be adjusted to reproduce a color image with good gradation.

Figure 13:
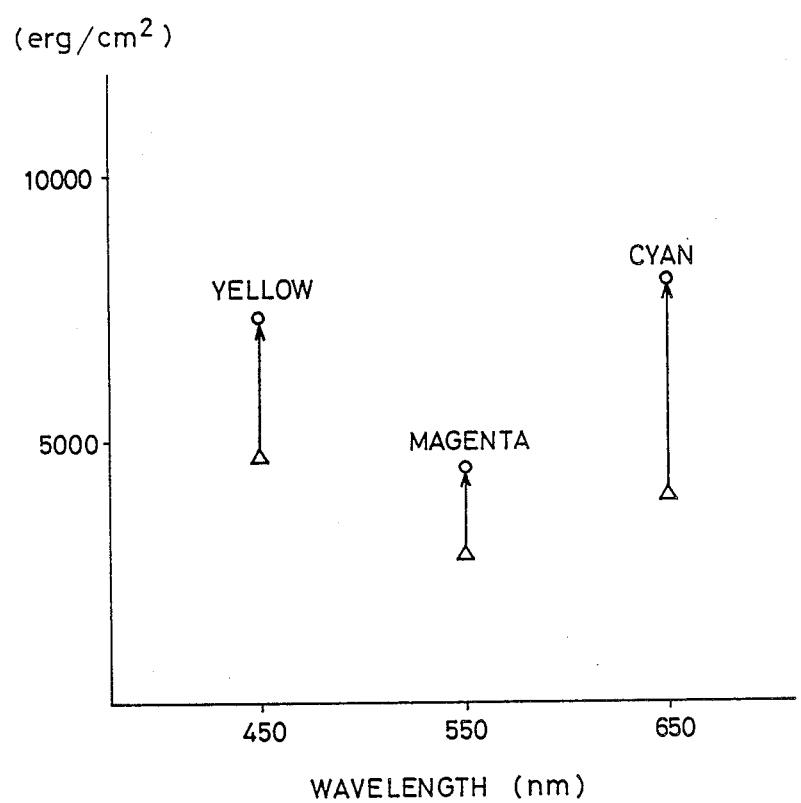
FIG. 13 is a view explaining an example of an optical sensitivity characteristic of a photosensitive paper.

For instance, the photosensitive paper OS has exposure sensitivity characteristic as indicated in FIG. 13. In this photosensitive paper OS, a photosensitive component corresponding to a yellow image starts to produce yellow color when the paper is exposed to an energy of 5,000 erg/cm$^2$ of a radiation having a wavelength of 450 nm. The density of the yellow color produced reaches the maximum 100% level when the radiant energy increases to 7,000 erg/cm$^2$. The density increases from 0% to 100% in linear proportion to the radiant energy (5,000 to 7,000 erg/cm$^2$). A photosensitive component corresponding to a magenta image starts to produce magenta color when the paper is exposed to an energy of 3,000 erg/cm$^2$ of a radiation having a wavelength of 550 nm. The density of the magenta color reaches the maximum 100% level at the radiant energy of 4,500 erg/cm$^2$. A photosensitive component corresponding to a cyan image starts to produce cyan color when the paper is exposed to an energy of 4,000 erg/cm$^2$ of a radiation having a wavelength of 650 nm. The maximum 100% density of the cyan color is obtained at the radiant energy of 8,000 erg/cm$^2$. In order to obtain black of the color gradation of a reproduced image, the densities of the yellow, magenta and cyan colors must be 100%. Therefore, the photosensitive paper OS must be exposed to 7,000 erg/cm$^2$ radiant energy of 450 nm, 4,500 erg/cm$^2$ of 550 nm, and 8,000 erg/cm of 650 nm. If the energies of the 450 nm radiation (yellow radiation), 550 nm radiation (magenta radiation) and 650 nm radiation (cyan radiation) produced by the CRT per unit time are the same, the ratio of the time duration for which the paper OS is exposed to the respective wavelength radiations should be 7:4.5:8, in order to produce the black color.

However, the ratio of the exposure times should be adjusted if it is desired to provide an image having a smooth gradation. For instance, the photosensitive paper OS of FIG. 13 should be exposed to 5,000 erg/cm$^2$ of the yellow radiation, 3,000 erg/cm$^2$ of the magenta radiation, and 4,000 erg/cm$^2$ of the cyan radiation. To this end, the ratio of the exposure times should be adjusted to 5:3:4. Thus, the control signals to be applied from the controller CTL to the driver circuits CY, CM and CC should be finely adjusted depending upon the desired result of reproduction of an image. Further, the three exposing operations cannot be completed at the same time, since the exposure times for the yellow, magenta and cyan components of the photosensitive paper are different.

It is considered that the amplification degrees of the driver circuits CY, CM and CC (i.e., luminance values of the respective electron guns of the CRT) are preadjusted in order to permit the concurrent exposing operations for the three photosensitive components of the paper OS, so that the exposing operations are completed at the same time. However, the use of variable resistors RTY, RTM, RTC in the driver circuits CY, CM, CC is not sufficient to provide a desired or correct gradation of a reproduced image, since the ranges of the required radiant energies to change the color density from 0% to 100% level are different for the three colors, as indicated in FIG. 13. More specifically, if the radiant energies are adjusted so as to obtain a nominal white color, an obtained black color tends to be deteriorated. If the amplification degrees of the driver circuits are adjusted to obtain a nominal black color, an obtained white color tends to be deteriorated. The same problem is encountered when the radiant energies or amplification degrees are adjusted to reproduce an image with a desired chromaticity. For these reasons, it is impossible to complete the exposures of the different photosensitive components of the paper OS, at the same time.

The irradiating arrangements of FIGS. 6 and 11 according to the present invention which use the driver circuits 82–84 are capable of driving the electron guns 82–84, depending upon the exposure sensitivity characteristic of the photosensitive medium, and are capable of completing the exposures of the three photosensitive components of the medium at the same time.

Figure 7:
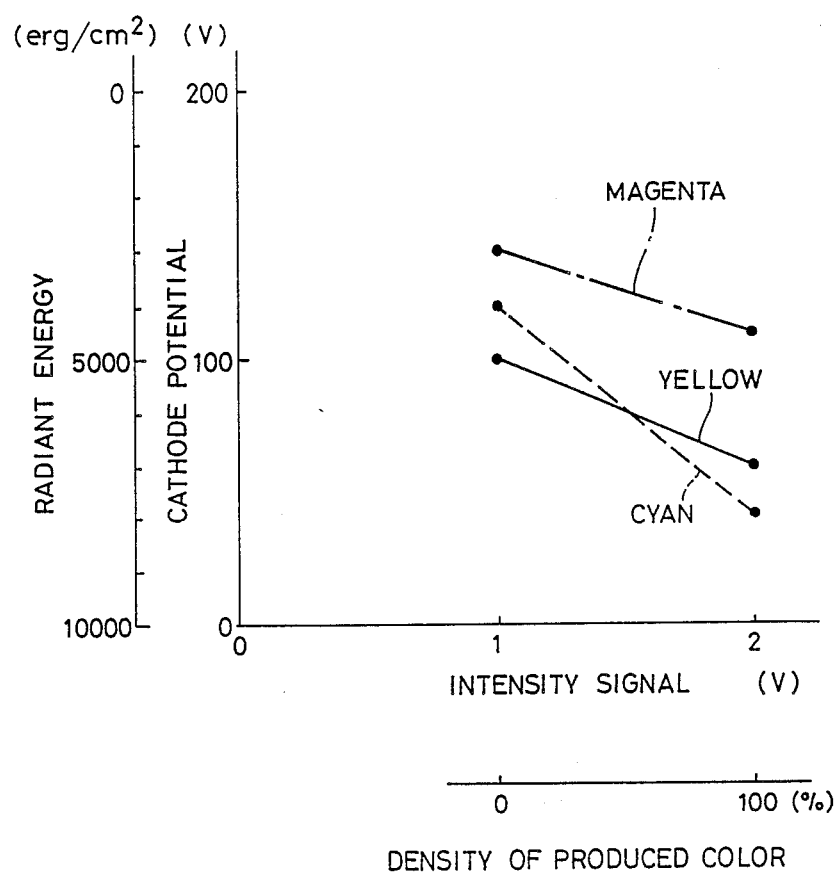
FIG. 7 is a graph illustrating a relationship between the level of an intensity signal applied to the cathode ray tube, and the cathode potential of the tube and the corresponding radiant energy.

It will be understood from the graph of FIG. 7 that the embodiment of FIG. 6 is adapted to be used with a photosensitive medium whose microcapsules are softened due to exposure to an image radiation, so that the density of colors produced by the microcapsules increases as the radiant energy of the image radiation increases, as indicated in FIG. 7. However, the embodiment of FIG. 6 may be modified to use a photosensitive medium whose microcapsules are hardened or cured due to exposure to the image radiation. In this case, the density of the colors produced by the microcapsules decreases as the radiant energy of the image radiation increases, contrary to the graph of FIG. 7. Namely, the density-radiant energy curves for the yellow, magenta and cyan images are inclined upwardly as the density increases, if the microcapsules are cured upon exposure to the image radiation. Described more specifically, if the microcapsules are exposed to the maximum radiant energy, the microcapsules are completely cured and no colors are produced on the developer sheet. If the microcapsules are exposed to the minimum radiant energy or smaller, the microcapsules remain uncured, and are therefore ruptured completely, producing the colors of 100% density. In this modified embodiment, too, the cathode potentials of the driver circuits for the yellow, magenta and cyan images are suitably determined.

A yet further embodiment of the present invention is shown in FIG. 14. In this embodiment, the characteristic of each electron gun of a cathode ray tube is changed so as to emit an image radiation which meets the optical sensitivity characteristic of a photosensitive medium. That is, the radiant energy for each photosensitive color component of the photosensitive medium is varied by changing a stream of electrons emitted by the electron gun, depending upon the sensitivity of the corresponding photosensitive color component of the photosensitive medium.

Figure 15:
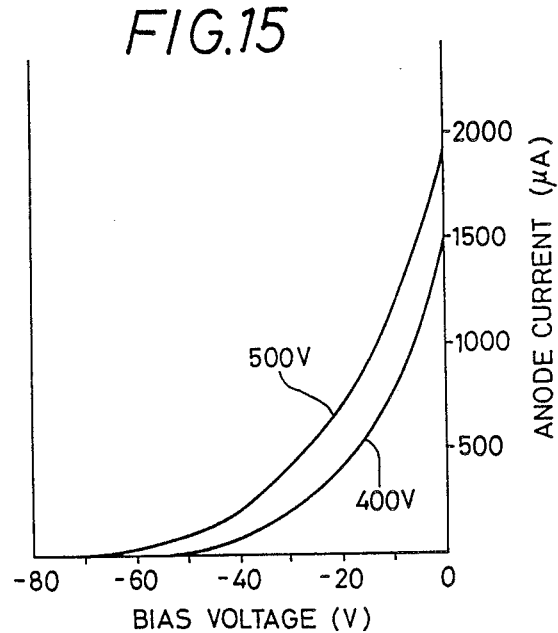
FIG. 15 is a graph showing a relationship between an anode current and a bias voltage of the cathode ray tube of FIG. 12.
Figure 16:
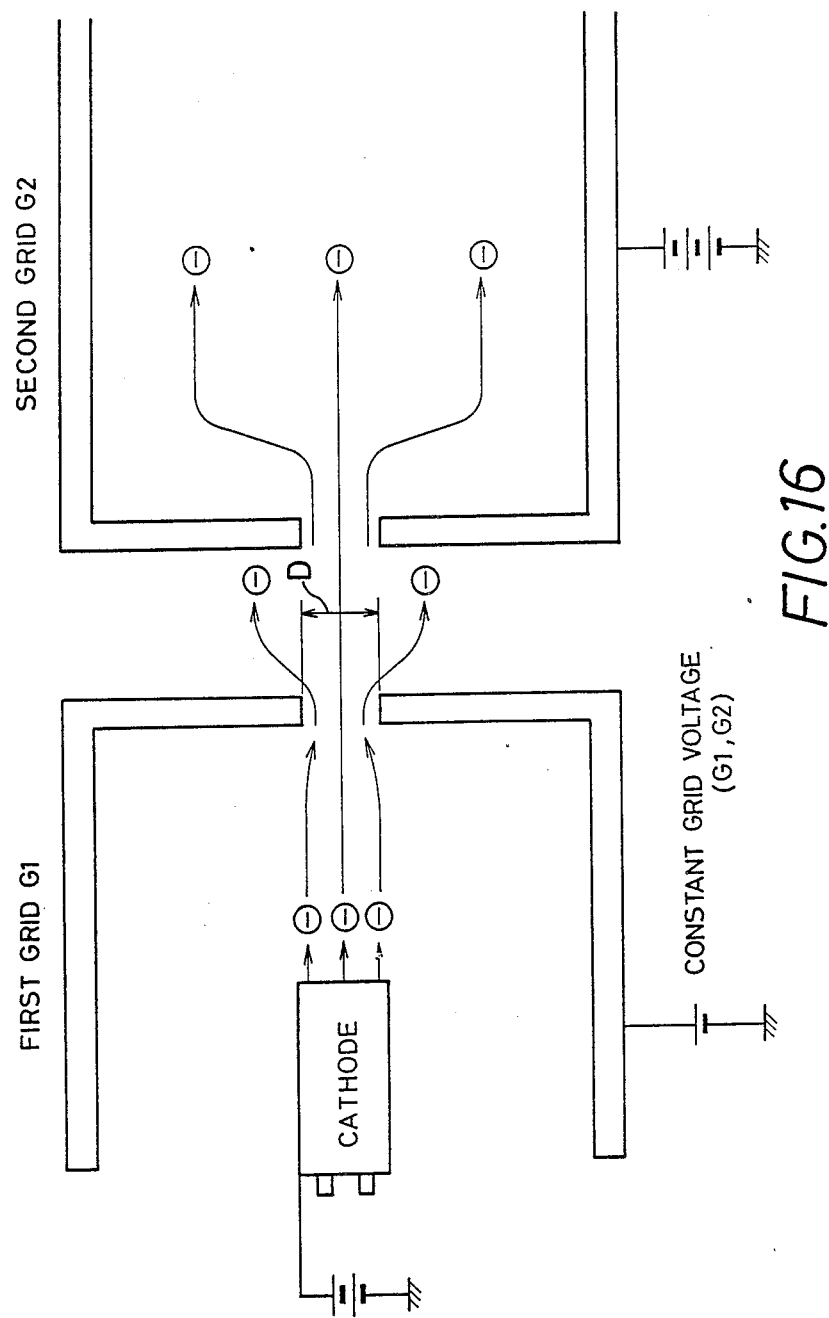
FIG. 16 is a schematic view illustrating a grid arrangement of the cathode ray tube of FIG. 12.

Described more specifically, the amount of movement or flow of electrons in the cathode ray tube of FIG. 14 is determined by a relationship between an anode current, and a bias voltage which is a difference between a grid voltage and a cathode voltage, as indicated in FIG. 15. Further, the anode current of the cathode ray tube can be increased by increasing a voltage of a second grid G2. Thus, by changing the relationship between the anode current and the bias voltage, the radiant energy of the relevant electron gun can be varied between the maximum and minimum levels, depending upon the exposure sensitivity of the corresponding photosensitive color component (yellow, magenta, cyan) of the photosensitive medium. The radiant energy of the electron gun can also be varied by changing a diameter D of an aperture through which electrons move from the first grid G1 toward a second grid G2, as indicated in FIG. 16.

Figure 17:
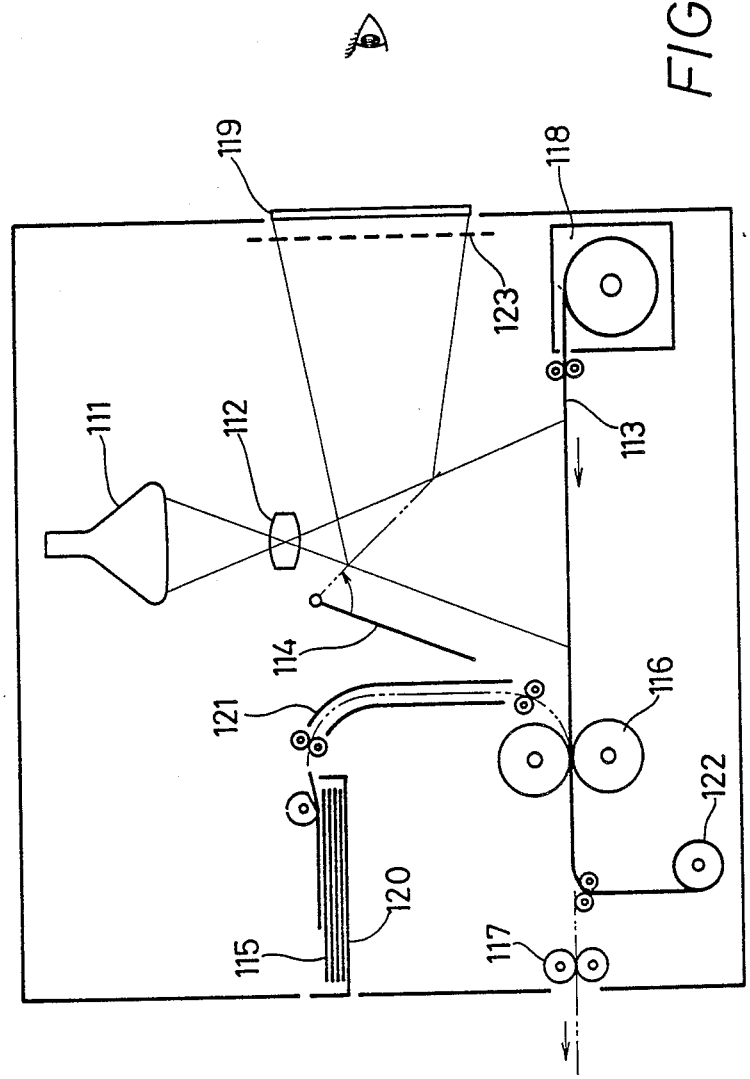
FIG. 17 is a schematic view showing another embodiment of the invention.

Referring next to FIG. 17, there is shown another embodiment of the present invention in the form of a color imaging apparatus capable of serving as a projector as well as a copier.

The apparatus uses a cathode ray tube (CRT) 111 which emits an image radiation representative of an original image to be reproduced. The image radiation is focused by a focusing lens 112 on a portion of a photosensitive web 113, so that the portion is imagewise exposed to the image radiation. The photosensitive web 113 may be a photosensitive medium as disclosed in U.S. Pat. No. 3,219,446. More specifically, the photosensitive web 113 has a coating of photosensitive microcapsules formed on a substrate. The photosensitive microcapsules consist of cyan microcapsules each of which contains a cyan chromogenic material, magenta microcapsules each of which contains a magenta chromogenic material, and yellow microcapsules each of which contains a yellow chromogenic material. The photosensitive web 113 is supplied from a roll accommodated in a supply cassette 118, and is fed through an exposing section at which the web 113 is imagewise exposed to the image radiation emitted by the CRT 111.

Figure 18:
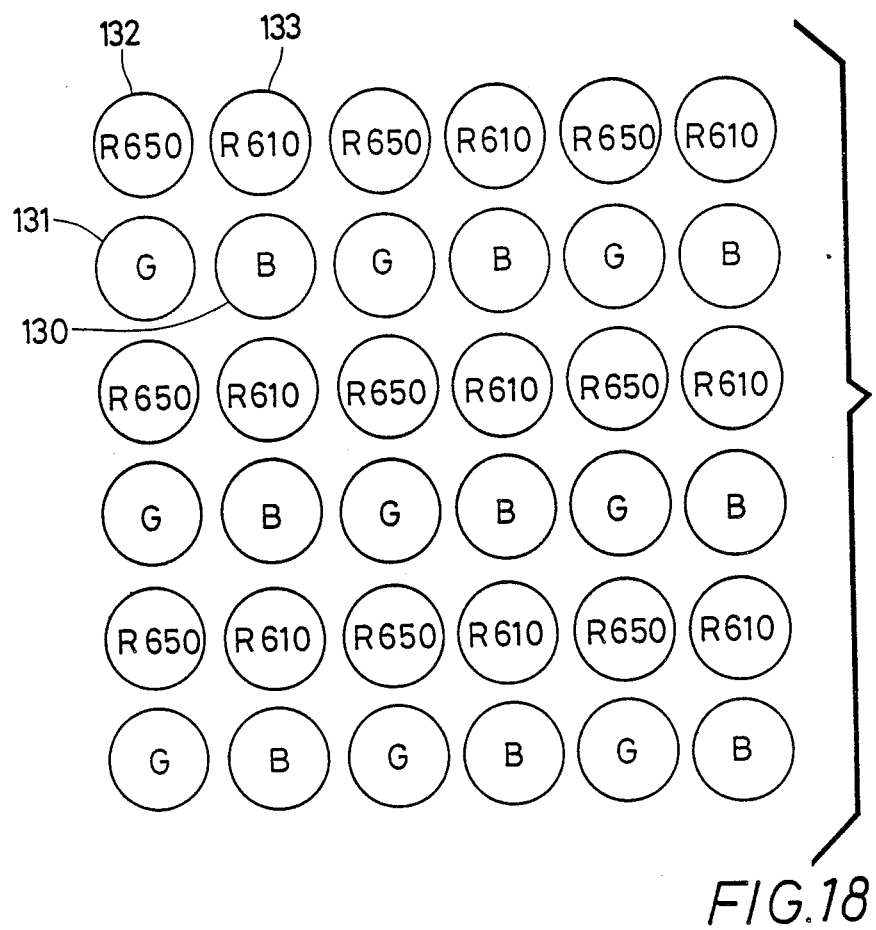
FIG. 18 is an illustration depicting an arrangement of different fluorescent elements provided on a fluorescent screen surface of a cathode ray tube used in the embodiment of FIG. 17.
Figure 20:
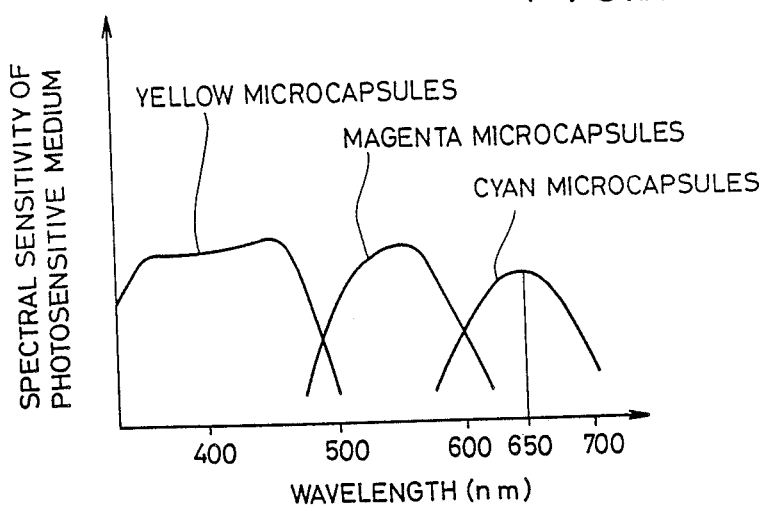
FIG. 20 is a view showing the spectral sensitivity of a photosensitive medium.
Figure 21:
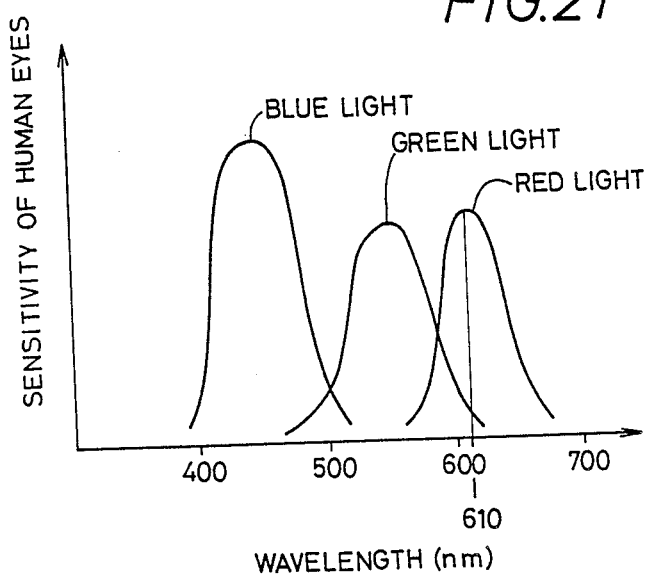
FIG. 21 is a view showing the sensitivity of human eyes.

The spectral sensitivity of the photosensitive web 113 is illustrated in the graph of FIG. 20, which indicates that the cyan microcapsules are most sensitive to a radiation having a wavelength of 650 nm, while the magenta and yellow microcapsules are most sensitive to radiations having wavelengths of 550 nm and 450 nm, respectively. On the other hand, the human eyes are most sensitive to red, green and blue radiations having wavelengths of about 610 nm, 550 nm and 450 nm, respectively, as indicated in the graph of FIG. 21. The red, green and blue radiations correspond to the cyan, magenta and yellow microcapsules, respectively. In view of the above fact, the fluorescent surface of the fluorescent screen of the CRT 111 is coated with four different kinds of fluorescent elements (B), (G), (R650) and (R610), as shown in FIG. 18. The fluorescent elements (B) are blue fluorescent elements which emit blue light having a wavelength of 450 nm, and the fluorescent elements (G) are green fluorescent elements which emit green light having a wavelength of 550 nm. The fluorescent elements (R650) and (R610) are red fluorescent elements which emit red lights having wavelengths of 650 nm and 610 nm, respectively. These four kinds of fluorescent elements (B), (G), (R650) and (R610) are evenly distributed over the fluorescent surface of the CRT 111.

Figure 19:
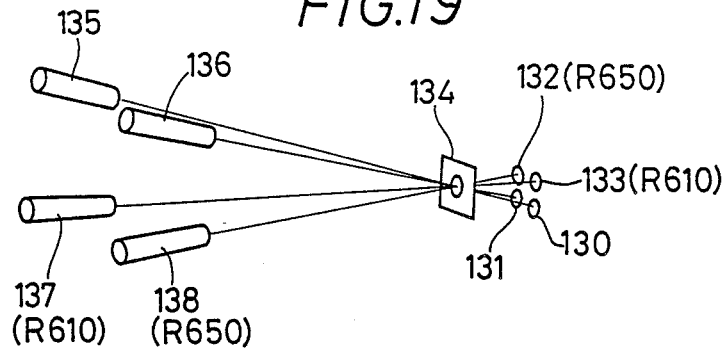
FIG. 19 is a view showing an arrangement of the CRT of FIG. 18.

As shown in FIG. 19, the CRT 111 has four electron guns 135, 136, 137 and 138 which correspond to the respective kinds of fluorescent elements (B) 130, (G) 131, (R650) 132 and (R610) 133. When the photosensitive web 113 is imagewise exposed to the image radiation from the CRT 111, the blue fluorescent elements (B) 130 are actuated by the blue electron gun 135, and the green fluorescent elements (G) 131 are actuated by the green electron gun 136. Further, the red (R650) electron gun 138 is used to actuate the red fluorescent elements (R650) 132 which suit the cyan microcapsules of the photosensitive web 113. With the use of the electron guns 135, 136 and 138, the photosensitive web 113 can be exposed in the optimum condition. Namely, the cyan microcapsules are suitably exposed to the 650 nm red light emitted by the red fluorescent elements (R650) 132 actuated by the red (650) electron gun 138.

When the image radiation from the CRT 111 is used to project an image on the viewing screen 119, the red (R610) electron gun 137 is used to actuate the red fluorescent elements (R610) 133 which suit the sensitivity of the human eyes in terms of the red light wavelength. With the use of the electron gun 137, the image reproduced on the viewing screen 119 is viewed naturally to the human eyes.

Figure 22:
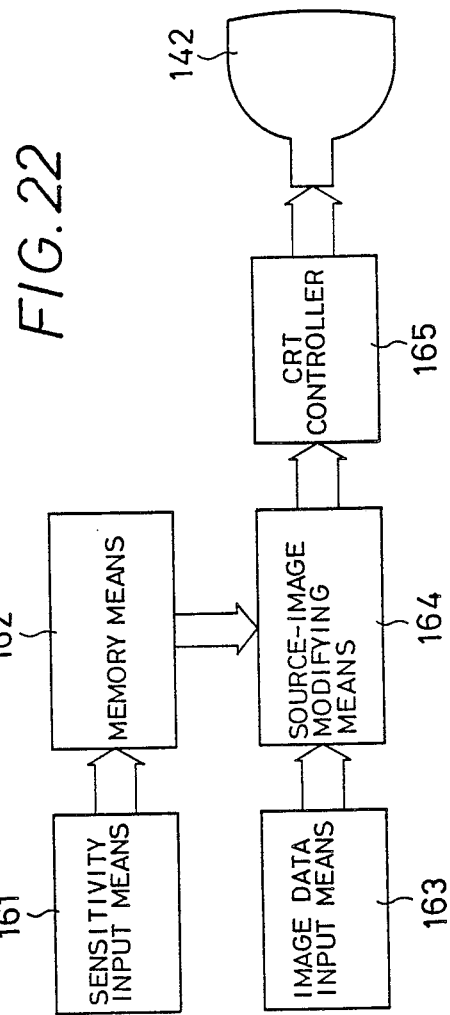
FIG. 22 is a block diagram showing an electronic control arrangement for controlling a cathode ray tube according to a further embodiment of the invention.

FIG. 22 shows a further embodiment of the invention, which shows a control system for controlling a cathode ray tube 142 which may be one of the tubes 102, 103, 104 of the embodiment of FIG. 11, for example. The control system includes: sensitivity input means 161 for entering optical sensitivity data of the photosensitive recording medium 143, 147; memory means 162 for storing the optical sensitivity data entered through the sensitivity input means 161; image data input means 163 for entering source image information representative of an original or source image to be reproduced; source-image modifying means 164 for modifying the source image information entered through the image data input means 163, according to the optical sensitivity data stored in the memory means 162; and a CRT controller 165 which controls the CRT 142 according to the modified source image information. The memory means 162 has suitable back-up means for maintaining a memory content even while the apparatus is off.

It will be understood that the quality of an image reproduced on the developer sheet 147 may be adjusted, by controlling an optical image on the fluorescent surface of the CRT 142. There will be described a manner in which the image on the CRT 142 is controlled by the CRT controller 165.

The operator enters the optical or exposure sensitivity data of the photosensitive medium to be used, e.g., a photosensitive web and a developer sheet, through the sensitivity input means 161. The entered data is stored in the memory means 162. In the meantime, the source image information representative of the desired source image is entered through the image data input means 163 and is fed to the source-image modifying means 164. The source image information is modified by the modifying means 164 into modified image information, according to the optical sensitivity data stored in the memory means 162. The modified image information is applied to the CRT controller 165, which in turn drives the CRT 142 according to the modified image information, whereby an image representative of the modified image information is produced on the fluorescent screen of the CRT 142.

Thus, the image produced on the fluorescent screen of the CRT 142 reflects the optical sensitivity of the photosensitive medium. Therefore, the instant image forming apparatus assures a nominal imaging on the CRT 142, even where the optical sensitivity of the photosensitive medium fluctuates, as long as the sensitivity data of the photosensitive medium to be used is entered and stored in the memory means 162.

The source-image modifying means 164 will be described in detail.

Figure 23:
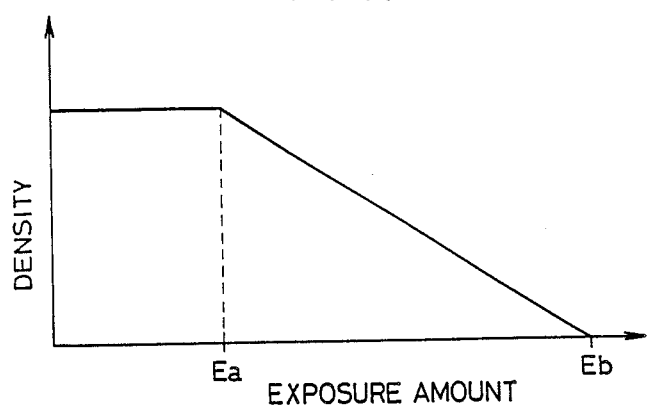
FIG. 23 is a graph indicating a relationship between the density of color produced on a photosensitive microcapsule medium, and an exposure amount of the medium.

The graph of FIG. 23 shows a relationship between the exposure amount of the photosensitive web, and the density of a color produced on the developer sheet. It will be understood from the graph that the photosensitive medium has the following two characteristics:
(a) The photosensitive web has a basic minimum exposure amount (Ea) below which the density of the produced color remains constant (at the 100% level).
(b) The density of the produced color decreases down to the minimum (0% level), as the exposure amount increases from the minimum level (Ea) to a maximum level (Eb).

An intensity X of an image signal modified by the source-image modifying means 164 is represented by the following equation (1):

$$X = c \cdot Ea + x \cdot Eb / [Eb] \ldots \quad (1)$$

where, x: intensity of an image signal (source image information) from image data input means 163;

c: proportion constant depending upon the luminance of the CRT 142 and other factors of the irradiating and exposing system;

[Eb]: reference value of (Eb).

The reference value [Eb] is a value of (Eb) at which a desired or nominal image is produced on the CRT 142 when X=x, where Ea=0.

The intensity X of the modified image signal may be obtained by determining the proportion constant c and reference value [Eb] by experiments, and entering the sensitivity data (Ea) and (Eb) of the photosensitive medium through the sensitivity input means 161 into the memory means 162. The source-image modifying means 164 converts the original intensity x into the desired modified intensity X, according to the equation (1).

While the above description refers to the reproduction of a single-color image, the principle of the invention is applied to the reproduction of a full-color image. In this case, equations similar to the equation (1) are provided for respective primary colors of light, and the source image information or original image signal for each color (yellow, magenta, cyan) is modified according to the corresponding equation.

In the embodiment illustrated above, the two parameters, i.e., minimum and maximum exposure amounts (Ea) and (Eb) are selected as variables of the optical sensitivity of the photosensitive medium. It will be obvious, however, that the principle of the invention may be practiced with respect to other parameters. That is, the equation (1) provided above by way of an example may be represented by the following general formula (2):

$$X = F(x) \ldots \quad (2)$$

Figure 24:
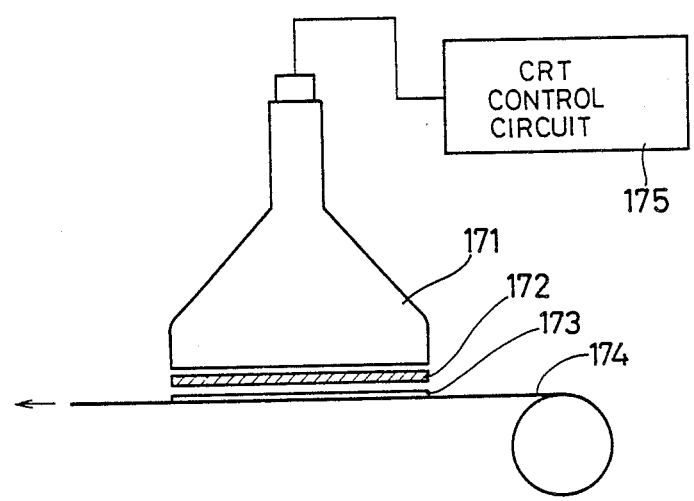
FIG. 24 is a schematic view of an irradiating device for exposing a photosensitive medium, through an original disposed adjacent to the medium, according to a still further embodiment of the invention.
Figure 25:
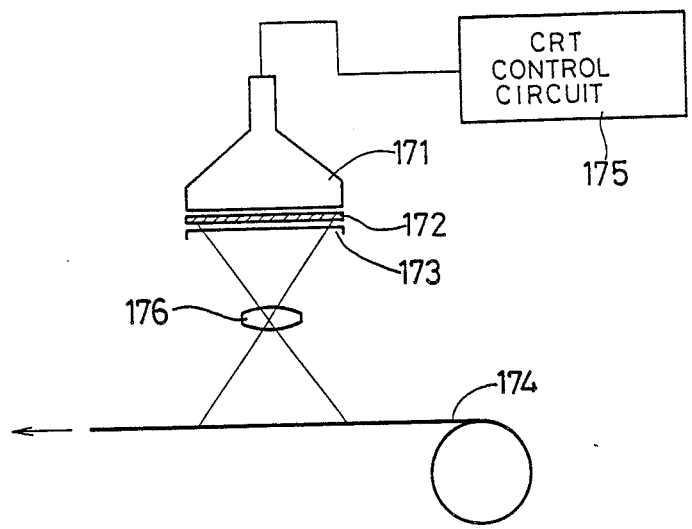
FIG. 25 is a schematic view showing a modification of the irradiating device of FIG. 25.

Referring to FIGS. 24 and 25, there are shown still further embodiments of the present invention in the form of an irradiating device for exposing a photosensitive medium.

The irradiating device of FIG. 24 includes a color imaging cathode ray tube 171 having a fluorescent screen which has three kinds of fluorescent light emitting elements corresponding to three primary colors of light (blue, green and red), which emit respective blue, green and red rays of light. These light emitting elements are actuated by image signals received from a CRT control circuit 175, so that an image radiation (consisting of the blue, green and red rays) produced on the fluorescent screen represents a desired image to be reproduced on a photosensitive medium 174. To assure even distribution of the blue, green and red rays, a diffusion plate 172 is disposed adjacent to the fluorescent surface of the cathode ray tube 171. An original 173 which bears an original image to be reproduced is supported adjacent and parallel to the diffusion plate 172, so that a portion of the photosensitive medium 174 which is passed right under the original 173 is imagewise exposed to the image radiation from the cathode ray tube 171, which has diffused through the diffusion plate 172 and which has been transmitted through the original 173. The CRT control circuit 175 is capable of adjusting the image signals applied to the cathode ray tube 171, for establishing a desired luminance of the fluorescent screen, and a desired color gradation of an image produced on the screen. The image signals may be manually controlled, or by a suitable image processing device (not shown) used in place of the control circuit 175.

When the image radiation from the cathode ray tube 171 is used to irradiate a viewing screen (not shown) disposed a suitable distance below the tube 171, the photosensitive web 174 is rewound on the supply roll, so that the image radiation transmitted through the original 173 is directed to the viewing screen.

While the cathode ray tube 171, diffusion plate 172 and original 173 are located close to the feed path of the photosensitive medium 174 in the arrangement of FIG. 24, this arrangement may be replaced by an arrangement as shown in FIG. 25, in which a focusing lens 176 is disposed between the original 173 located adjacent to the diffusion plate 172, and the photosensitive medium 174, so that the image radiation which has passed the original 173 is focused on the surface of the medium 174. In this case, too, the cathode ray tube 171 equipped with the diffusion plate 172 can be suitably utilized as irradiating means for exposing the photosensitive medium 174, and irradiating a viewing screen as shown in the preceding embodiments.

The diffusion plate 172 may be eliminated if a glass plate of the fluorescent screen consists of a frosted or ground glass which is capable of diffusing the emitted radiation.

While the present invention has been described in its presently preferred embodiments with a certain degree of particularity, it is to be understood that the invention made be embodied with various alterations, modifications and improvements, which may occur to those skilled in the art, without departing from the spirit and scope of the invention defined in the following claims.

What is claimed is:

1. An irradiating device for producing a radiation to which a photosensitive recording medium is imagewise exposed to produce a color image on said recording medium, said recording medium bearing on a surface thereof at least two kinds of photosensitive components which are sensitive to said radiation and which produce respective colors with a density which varies with an intensity of said radiation, comprising:

signal converting means for converting an original intensity signal representative of a density of each of colors of an original image which correspond to said respective colors produced by said respective at least two kinds of photosensitive components of said photosensitive recording medium, into a modified intensity signal corresponding to a desired density of a corresponding one of said respective colors produced on said photosensitive recording medium due to exposure of said medium to said radiation, according to a relationship between an intensity of said radiation and a density of each of said respective colors produced by said at least two kinds of photosensitive components on said medium due to exposure of said medium to said radiation; and optical image forming means for forming optical images corresponding to said at least two kinds of photosensitive components, according to said modified intensity signal.

2. An irradiating device for producing a radiation to which a photosensitive recording medium is imagewise exposed, to produce a color image on said recording medium, said recording medium bearing on a surface thereof at least two kinds of photosensitive components which are sensitive to said radiation and which produce respective colors with a density which varies with an intensity of said radiation, wherein the improvement comprises:

a cathode ray tube including a plurality of electron guns each of which produces a radiation corresponding to each of said at least two kinds of photosensitive components, a sensitivity of each of said electron guns to an input signal applied thereto being determined depending upon said density of a corresponding one of said respective colors which is produced due to exposure of a corresponding one of said at least two kinds of photosensitive components to said intensity of said radiation produced by said each electron gun, such that the density of said corresponding color of said color image produced on said photosensitive recording medium is substantially equal to a density of a corresponding color of an original image.

3. An irradiating device for producing a radiation to which a photosensitive recording medium is imagewise exposed to reproduce an original image, comprising:
input means for entering optical sensitivity data of said photosensitive recording medium;
memory means for storing said optical sensitivity data entered through said input means;
source-image modifying means for modifying source image information representative of said original image according to said optical sensitivity data stored in said memory means; and
a cathode ray tube having a fluorescent surface which produces a visible image according to the source image information modified by said source-image modifying means.

4. An image processing apparatus, comprising:
irradiating means for emitting an image radiation representative of an original image, said irradiating means including a full-color imaging cathode ray tube;
projecting means having a viewing screen which is irradiated by said image radiation from said irradiating means and which provides a view of a visible image represented by said image radiation;
exposing means for exposing a photosensitive recording medium to said image radiation from said irradiating means;
optical guide means comprising optical path selecting means which is operable between a projecting position in which said image radiation is directed to said viewing screen of said projecting means, and an exposing position in which said image radiation is directed to said exposing means;
said irradiating means further including luminance changing means for changing the luminance of said cathode ray tube for at least one of the primary colors of light to an optimum value for exposure of said photosensitive recording medium by said exposing means, when said optical path selecting means is operated from said projecting position to said exposing position;
said luminance changing means including converting means for converting an original intensity signal applied to said cathode ray tube for said at least one primary color of light so as to produce a nominal color imaging on said viewing screen, to a modified intensity signal applied to said cathode ray tube so as to produce a nominal color imaging on said photosensitive recording medium, according to a relationship between an intensity of said image radiation for said primary color and a density of a color produced on said photosensitive recording medium due to exposure of said medium to said image radiation.

5. An image processing apparatus, comprising:
irradiating means for emitting an image radiation representative of an original image, said irradiating means including at least one single-color imaging cathode ray tube having a fluorescent screen which produces a visible image in a corresponding color;
projecting means having a viewing screen which is irradiated by said image radiation from said irradiating means and which provides a view of a visible image represented by said image radiation;
exposing means for exposing a photosensitive recording medium to said image radiation from said irradiating means;
optical guide means comprising optical path selecting means which is operable between a projecting position in which said image radiation is directed to said viewing screen of said projecting means, and an exposing position in which said image radiation is directed to said exposing means; and
said irradiating means further including luminance changing means for changing the luminance of said cathode ray tube for said corresponding color, to an optimum value for exposure of said photosensitive recording medium by said exposing means so as to produce a nominal density of said corresponding color, when said optical path selecting means is operated from said projecting position to said exposing position.

6. An image processing apparatus, comprising:
irradiating means for emitting an image radiation representative of an original image, said irradiating means including a fluorescent screen having a fluorescent surface which is coated with a multiplicity of projecting fluorescent elements and a multiplicity of exposing fluorescent elements;
projecting means having a viewing screen which is irradiated by said image radiation from said irradiating means and which provides a view of a visible image represented by said image radiation;
exposing means for exposing a photosensitive recording medium to said image radiation from said irradiating means;
optical guide means comprising optical path selecting means which is operable between a projecting position in which said image radiation is directed to said viewing screen of said projecting means, and an exposing position in which said image radiation is directed to said exposing means;
said projecting fluorescent elements of said fluorescent screen of said irradiating means emitting projecting beams suitable for a nominal imaging on said viewing screen of said projecting means, and said exposing fluorescent elements emitting exposing beams suitable for a nominal imaging on said photosensitive recording medium by said exposing means; and
said irradiating means further including first actuator means for selectively actuating said projecting fluorescent elements to emit said projecting beams, and second actuator means for selectively actuating said exposing fluorescent elements to emit said exposing beams.

7. An image processing apparatus, comprising:
irradiating means for emitting an image radiation representative of an original image;
projecting means having a viewing screen which is irradiated by said image radiating from said irradiating means and which provides a view of a visible image represented by said image radiation;
exposing means for exposing a photosensitive recording medium to said image radiation from said irradiating means;
optical guide means comprising splitting means for dividing said image radiation into two parts such that one of said two parts is directed toward one of said projecting means and said exposing means while the other of said two parts is concurrently directed toward the other of said projecting means and said exposing means; and said exposing means comprising a shutter which is movable between a shielding position in which said shutter shields said image radiation from said splitting means, to thereby prevent transmission of said image radiation toward said photosensitive recording medium, and an open position in which said shutter permits transmission of said image radiation from said splitting means toward said recording medium.

8. An image processing apparatus, comprising:

irradiating means for emitting an image radiation representative of an original image;

projecting means having a viewing screen which is irradiated by said image radiation from said irradiating means and which provides a view of a visible image represented by said image radiation;

exposing means for exposing a photosensitive recording medium to said image radiation from said irradiating means;

optical guide means comprising splitting means for dividing said image radiation into two parts such that one of said two parts is directed toward one of said projecting means and said exposing means while the other of said two parts is concurrently directed toward the other of said projecting means and said exposing means; and said irradiating means being operative in a normal mode for producing said image radiation such that said image radiation permits a nominal imaging on said viewing screen of said projecting means, and said irradiating means comprising modifying means for momentarily modifying the image radiation of the normal mode into a modified image radiation for a predetermined duration at a predetermined time interval, such that said modified image radiation is effective to permit a nominal imaging on said photosensitive recording medium due to exposure of said medium to said modified image radiation, said predetermined duration and time interval being selected so as not to influence said nominal imaging on said viewing screen as viewed by human eyes.

9. An image processing apparatus, comprising:

irradiating means for emitting an image radiation representative of an original image, said irradiating means including a cathode ray tube which produces an image on a fluorescent screen thereof according to source image information representative of said original image;

projecting means having a viewing screen which is irradiated by said image radiation from said irradiating means and which provides a view of a visible image represented by said image radiation;

exposing means for exposing a photosensitive recording medium to said image radiation from said irradiating means;

optical guide means for directing said image radiation from said irradiating means to said projecting means and said exposing means; and said irradiating means further including input means for entering optical sensitivity data of said photosensitive recording medium, memory means for storing said optical sensitivity data entered through said input means, and source-image modifying means for modifying said source image information supplied to said cathode ray tube, according to said optical sensitivity data stored in said memory means.

10. An image processing apparatus for reproducing an original image on a photosensitive recording medium having at least two kinds of photosensitive components which are sensitive to radiation and which produce respective colors with a density which varies with an intensity of the radiation, said apparatus comprising:

an irradiating device for producing said radiation to imagewise expose said photosensitive recording medium, for producing color images corresponding to said respective colors, on said recording medium; and support means for supporting said photosensitive recording medium, so as to expose said photosensitive recording medium to said radiation, to form a latent image corresponding to said original image, on an exposed portion of the medium, wherein said irradiating device comprises signal converting means for converting an original intensity signal representative of a density of each of colors of said original image which correspond to said respective colors produced by said respective at least two kinds of photosensitive components of said photosensitive recording medium, into a modified intensity signal corresponding to a desired density of a corresponding one of said respective colors produced on said photosensitive recording medium due to exposure of said medium to said radiation, according to a relationship between an intensity of said radiation and a density of each of said respective colors produced by said at least two kinds of photosensitive components on said medium due to exposure of said medium to said radiation, and optical image forming means for forming optical images corresponding to said at least two kinds of photosensitive components, according to said modified intensity signal.

11. An image processing apparatus according to claim 10, further comprising optical means for directing said radiation from said irradiating device to said photosensitive recording medium.

12. An image processing apparatus according to claim 10, further comprising:

projecting means having a viewing screen which is irradiated by said optical images formed by said optical image forming means of said irradiating device, said viewing screen providing a view of a visible image corresponding to said original image; and exposing means for exposing said photosensitive recording medium to said radiation to form said latent image.

13. An image processing apparatus according to claim 12, further comprising optical guide means for directing said optical images from said irradiating device to said projecting means and said exposing means.

14. An image processing apparatus according to claim 10, further comprising developing means for developing said latent image on said exposed portion of said photosensitive recording medium, into a visible image.

15. An image processing apparatus according to claim 10, wherein said photosensitive recording medium has a layer of microcapsules which consist of at least two groups of microcapsules corresponding to said at least two kinds of photosensitive components, the microcapsules of each of said at least two groups containing a chromogenic material for producing a corresponding one of said respective colors and a photosensitive resin the mechanical strength of which is varied according to an amount of exposure to said optical images.

16. An image processing apparatus according to claim 15, further comprising exposing means for exposing said layer of microcapsules to said optical images, to form a latent image corresponding to said original image, on an exposed portion of the medium, and developing means for applying a pressure to said exposed portion of said photosensitive recording medium, and thereby rupturing said microcapsules according to said mechanical strength of said photosensitive resin, to permit said chromogenic material to chemically react with a developing material, whereby said latent image is developed into a visible image.

17. An image processing apparatus comprising:

first support means for supporting a photosensitive recording medium;

a color imaging cathode ray tube having a fluorescent surface which emits visible light in desired colors;

a diffusing plate disposed so as to face said fluorescent surface of said cathode ray tube, for diffusing said visible light;

second support means for supporting an original bearing an original image, such that said original is exposed to said visible light diffused by said diffusing plate, said first support means being disposed so that said photosensitive recording medium is exposed to said visible light influenced by said original; and wherein said first and second support means are disposed such that said original is disposed between said diffusing plate and said photosensitive recording medium, so that said recording medium is exposed to said visible light which is transmitted through said original.

* * * * *